United States Patent
Wu et al.

(10) Patent No.: US 12,463,183 B2
(45) Date of Patent: Nov. 4, 2025

(54) DISPLAY PANEL AND WINDOW WITH DUMMY REGION

(71) Applicant: InnoLux Corporation, Miao-Li County (TW)

(72) Inventors: Yuan-Lin Wu, Miao-Li County (TW); Yu-Chia Huang, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 535 days.

(21) Appl. No.: 17/547,246

(22) Filed: Dec. 10, 2021

(65) Prior Publication Data
US 2022/0223569 A1 Jul. 14, 2022

(30) Foreign Application Priority Data
Jan. 12, 2021 (CN) .......................... 202110038172.8

(51) Int. Cl.
*H01L 25/075* (2006.01)
*H01L 23/538* (2006.01)
*H10H 20/857* (2025.01)

(52) U.S. Cl.
CPC ...... *H01L 25/0753* (2013.01); *H01L 23/5387* (2013.01); *H10H 20/857* (2025.01)

(58) Field of Classification Search
CPC . H01L 25/0753; H01L 23/5387; H01L 33/62; H10H 20/857; H10K 77/111; H10K 59/131; G09F 9/301; E06B 7/28
See application file for complete search history.

(56) References Cited

U.S. PATENT DOCUMENTS

| 10,037,947 | B1* | 7/2018 | Tischler | H01L 33/505 |
| 2015/0214503 | A1* | 7/2015 | Ke | H01L 27/1259 438/127 |
| 2016/0043109 | A1* | 2/2016 | Nam | H01L 29/4966 257/72 |
| 2018/0308912 | A1 | 10/2018 | Kim | |
| 2019/0189087 | A1 | 6/2019 | Hélot | |
| 2019/0315648 | A1* | 10/2019 | Kumar | C03C 3/085 |
| 2020/0111978 | A1* | 4/2020 | Kim | H10K 59/131 |
| 2020/0393936 | A1 | 12/2020 | Bok | |
| 2021/0408510 | A1* | 12/2021 | Xiong | H10K 71/00 |

FOREIGN PATENT DOCUMENTS

CN 111009564 A 4/2020

* cited by examiner

*Primary Examiner* — William B Partridge
*Assistant Examiner* — David Paul Sedorook
(74) *Attorney, Agent, or Firm* — Winston Hsu

(57) ABSTRACT

The present disclosure provides a display panel and a window. The display panel includes a flexible substrate, a plurality of light-emitting units, a peripheral circuit, and a circuit board. The flexible substrate includes a display region, a peripheral circuit region, and a dummy region. The peripheral circuit region is adjacent to the display region. The dummy region surrounds the peripheral circuit region and forms a gap. The light-emitting units are disposed in the display region. The peripheral circuit is disposed in the peripheral circuit region and used to drive the light-emitting units. The circuit board is electrically connected to the peripheral circuit through the gap.

16 Claims, 17 Drawing Sheets

DISPLAY PANEL AND WINDOW WITH DUMMY REGION

CROSS REFERENCE TO RELATED APPLICATION

This application claims the benefit of Chinese Patent Application Serial No. 202110038172.8, filed Jan. 12, 2021, the entire content of which is incorporated herein by reference.

BACKGROUND OF THE DISCLOSURE

1. Field of the Disclosure

The present disclosure relates to a display panel and a window, and more particularly to a flexible display panel and a window applying the flexible display panel.

2. Description of the Prior Art

Recently, display panels have been developed from flat display panels to curved display panels, and even foldable display panels, so that the applications of display panels are more and more widespread. However, while the flexible display panel is applied to objects with curved surfaces, for example, applied to a car window with a curved surface, the flexible display panel may be wrinkled, which causes damage to wires and components of the display panel. Therefore, the application fields of the display panels are restricted.

SUMMARY OF THE DISCLOSURE

An embodiment of the present disclosure provides a display panel, which includes a flexible substrate, a plurality of light-emitting units, a peripheral circuit, and a circuit board. The flexible substrate includes a display region, a peripheral circuit region, and a dummy region. The peripheral circuit region is adjacent to the display region, and the dummy region surrounds the peripheral circuit region and forms a gap. The light-emitting units are disposed in the display region. The peripheral circuit is disposed in the peripheral circuit region and used to drive the light-emitting units. The circuit board is electrically connected to the peripheral circuit through the gap.

These and other objectives of the present disclosure will no doubt become obvious to those of ordinary skill in the art after reading the following detailed description of the embodiment that is illustrated in the various figures and drawings.

DETAILED DESCRIPTION

Figure 1:
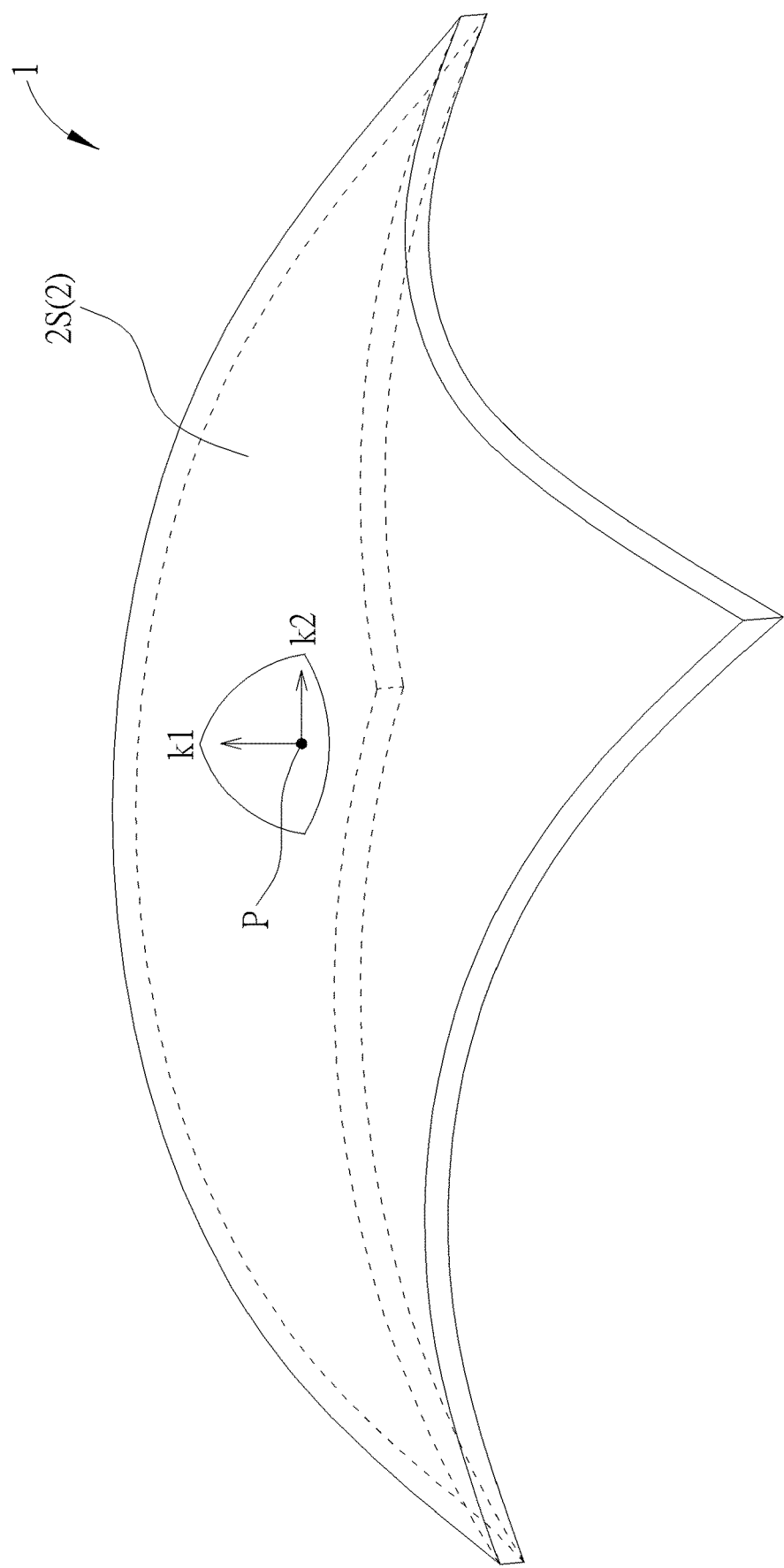
FIG. 1 is a schematic diagram of a window according to some embodiments of the present disclosure.

The following is a detailed description of display panels and windows according to some embodiments of the present disclosure. It should be understood that many different embodiments are provided in the following description to implement different aspects of the present disclosure. The following specific components and arrangements are just to briefly and clearly describe some embodiments of the present disclosure, which are just examples, and the present disclosure is not limited thereto. In addition, for clear description, similar and/or corresponding reference numerals may be used to designate similar components in different embodiments. However, these similar reference numerals are used to describe some embodiments simply and clearly, and do not represent any relationship between the different embodiments and/or structures discussed.

When the term "on" or "above" is used in the following description, it includes the case of one feature being in direct contact with another feature, or there may be one or more other components disposed between the two features, in this case one feature may not be in direct contact with another feature.

The contents of the present disclosure will be described in detail with reference to specific embodiments and drawings. It is noted that, for purposes of illustrative clarity and being easily understood by the readers, the following drawings may be simplified schematic diagrams, and components therein may not be drawn to scale. In addition, the numbers and dimensions of the components in the drawings are just illustrative, and are not intended to limit the scope of the present disclosure.

Certain terms are used throughout the specification and the appended claims of the present disclosure to refer to specific components. Those skilled in the art should understand that electronic equipment manufacturers may refer to a component by different names, and this document does not intend to distinguish between components that differ in name but not function. In the following description and claims, the terms "comprise", "include" and "have" are open-ended fashion, so they should be interpreted as "including but not limited to . . . ".

The ordinal numbers used in the specification and the appended claims, such as "first", "second", etc., are used to describe the components of the claims. It does not mean that the component has any previous ordinal numbers, nor does it represent the order of a certain component and another component, or the sequence of a manufacturing method, these ordinal numbers are just used to make a component with a certain name be clearly distinguishable from another component with the same name.

In addition, when a feature is described as "on another feature", the two features have a vertical relationship in the top view direction, this feature may be above or below another feature, and this vertical relationship depends on the orientation of the device.

As disclosed herein, the terms "approximately", "about", and "substantially" generally mean within 10%, 5%, 3%, 2%, 1%, or 0.5% of a given value or range. The quantity disclosed herein is an approximate quantity, that is, without a specific description of "approximately", "about", "substantially", the quantity may still include the meaning of "approximately", "about", and "substantially". In addition, the term "in a range from a first numerical value to a second numerical value" means that the range includes the first numerical value, the second numerical value, and other numerical values therebetween.

It should be understood that according to the following embodiments, features of different embodiments may be replaced, recombined or mixed to constitute other embodiments without departing from the spirit of the present disclosure. The features of various embodiments may be mixed arbitrarily and used indifferent embodiments without departing from the spirit of the present disclosure or conflict between these features.

In the present disclosure, the depth, the length and the width may be measured by using an optical microscope. The depth may also be obtained by measuring the cross-sectional image in an electron microscope, but not limited thereto. In addition, there may be a certain error in any two values or directions used for comparison. If a first value is equal to a second value, it implies that there may be an error of about 10% between the first value and the second value. If a first direction is perpendicular to a second direction, the angle between the first direction and the second direction may be ranged from 80 degrees to 100 degrees. If a first direction is parallel to a second direction, the angle between the first direction and the second direction may be ranged from 0 degrees to 10 degrees.

Unless otherwise defined, all terms (including technical and scientific terms) used herein have the same meaning as commonly understood by those skilled in the art. It should be understood that these terms, such as those defined in commonly used dictionaries, should be interpreted as having meaning consistent with the relevant technology and the background or context of the present disclosure, and should not be interpreted in an idealized or excessively formal way, unless there is a special definition in the embodiments of the present disclosure.

The electronic devices of the present disclosure may include, for example, a display device, an antenna device, a sensor device, a touch display device, a curved display device, or a non-rectangular display device (free shaped display). The electronic devices may be bendable or flexible spliced display devices, but not limited thereto. The electronic devices may include, for example, a light-emitting diode (LED), liquid crystal, fluorescence, phosphor, quantum dot (QD), other suitable display medium, or a combination thereof, but not limited thereto. The light-emitting diode may include, for example, an organic light-emitting diode (OLED), an inorganic light-emitting diode, a sub-millimeter light-emitting diode (mini LED), a micro light-emitting diode (micro LED) or a quantum dot (QD) light-emitting diode (such as QLED, QDLED), or other LEDs using suitable materials, or any combination thereof, but not limited thereto. The antenna device may be, for example, a liquid crystal antenna, but not limited thereto. It should be noted that the electronic devices of the present disclosure may be any combination of the aforementioned devices, but not limited thereto. In addition, the appearance of the electronic devices may be rectangular, circular, polygonal, a shape with curved edges, or other suitable shapes. The electronic devices may have peripheral systems such as a driving system, a control system, a light source system, a shelf system, etc., to support a display device or an antenna device. The following electronic devices take a display panel attached to a transparent substrate of a window as an example, but not limited thereto.

FIG. 1 is a schematic diagram of a window according to some embodiments of the present disclosure. As shown in FIG. 1, a window 1 may include, for example, a transparent substrate 2 for attaching a display panel of any one of the following embodiments thereon. The transparent substrate 2 may have a Gauss curvature that is not equal to zero. In detail, the transparent substrate 2 may have a curved surface 2S, and the curved surface 2S may have the Gauss curvature that is not equal to zero. For example, the transparent substrate 2 may include glass, quartz, plastic or other substrates. For example, the window 1 may include, for example, a window of a vehicle, a window of a building, or other windows with curved surfaces. When a display panel is attached to the curved surface 2S, the display panel may be bent along the profile of the curved surface 2S of the transparent substrate 2. When the transparent substrate 2 includes the curved surface 2S whose Gauss curvature is not zero, the curved surface 2S will bend toward at least two different directions simultaneously. For example, the Gauss curvature of the transparent substrate 2 may be greater than zero or less than zero. In some embodiments, the transparent substrate 2 may also be replaced with an opaque substrate, but not limited thereto.

A Gauss curvature referred to in the present disclosure may be obtained as follows. A point at any position on the curved surface 2S may be selected, this point may be extended into two curves along the curved surface 2S that respectively have two major curvatures, and the Gauss curvature is the product of the two major curvatures. In detail, a point on the curved surface 2S may be extended into an infinite number of curves along the curved surface 2S, and each curve has its own curvature. The major curvature described herein is defined as: among the infinite number of curvatures, there is a maximum value, and the curvature of a curve perpendicular to the curve having the maximum value (Max) is the minimum value (Min) of the infinite number of curvatures. The curve with the maximum value and the curve with the minimum value are the two major curvatures of this point.

A method for determining a Gauss curvature in the present disclosure may include, for example, using a scanning equipment and a 3D analysis software (such as Design X 3D software, etc., but not limited thereto) for scanning and modeling the target curved surface 2S, and obtaining an objective Gauss curvature value after analysis.

The present disclosure provides several other methods for determining a Gauss curvature. A surface with a positive Gauss curvature may have a spherical or protruding shape. A surface with a negative Gauss curvature may have a saddle-like shape. In the present disclosure, there are several methods to determine whether the Gauss curvature is positive, negative, or zero. The first method is to arbitrarily take three non-collinear points on the curved surface 2S to form a triangle, and then determine whether the sum of the interior angles of the triangle is greater than 180 degrees, equal to or less than 180 degrees. When the Gauss curvature of the curved surface is positive, the sum of the interior angles of the triangle will be greater than 180 degrees. When the Gauss curvature of the curved surface is negative, the sum of the interior angles of the triangle will be less than 180 degrees. When the Gauss curvature of the surface is zero, the sum of the interior angles of the triangle will be equal to 180 degrees. It should be noted that within the error range of the sum of the interior angles of the triangle equal to 180 degrees plus or minus 5 degrees (175 degrees≤the sum of the interior angles of the triangle≤185 degrees), the Gauss curvature may be zero, but not limited thereto.

Another method for determining a Gauss curvature in the present disclosure may take any point P on the curved surface 2S, where the point P has a direction vector k1 and a direction vector k2 that are perpendicular to each other, and each direction vector has a curvature. The Gauss curvature of the curved surface 2S is the product of the curvature of the direction vector k1 and the curvature of the direction vector k2. As shown in FIG. 1, the curvature of the direction vector k1 and the curvature of the direction vector k2 are both positive numbers, so that the product of the curvatures of the two direction vectors k1 and k2 is also a positive number. Similarly, Gauss curvatures of curved surfaces with other shapes may also be determined by using this method, and not repeated herein.

Figure 2:
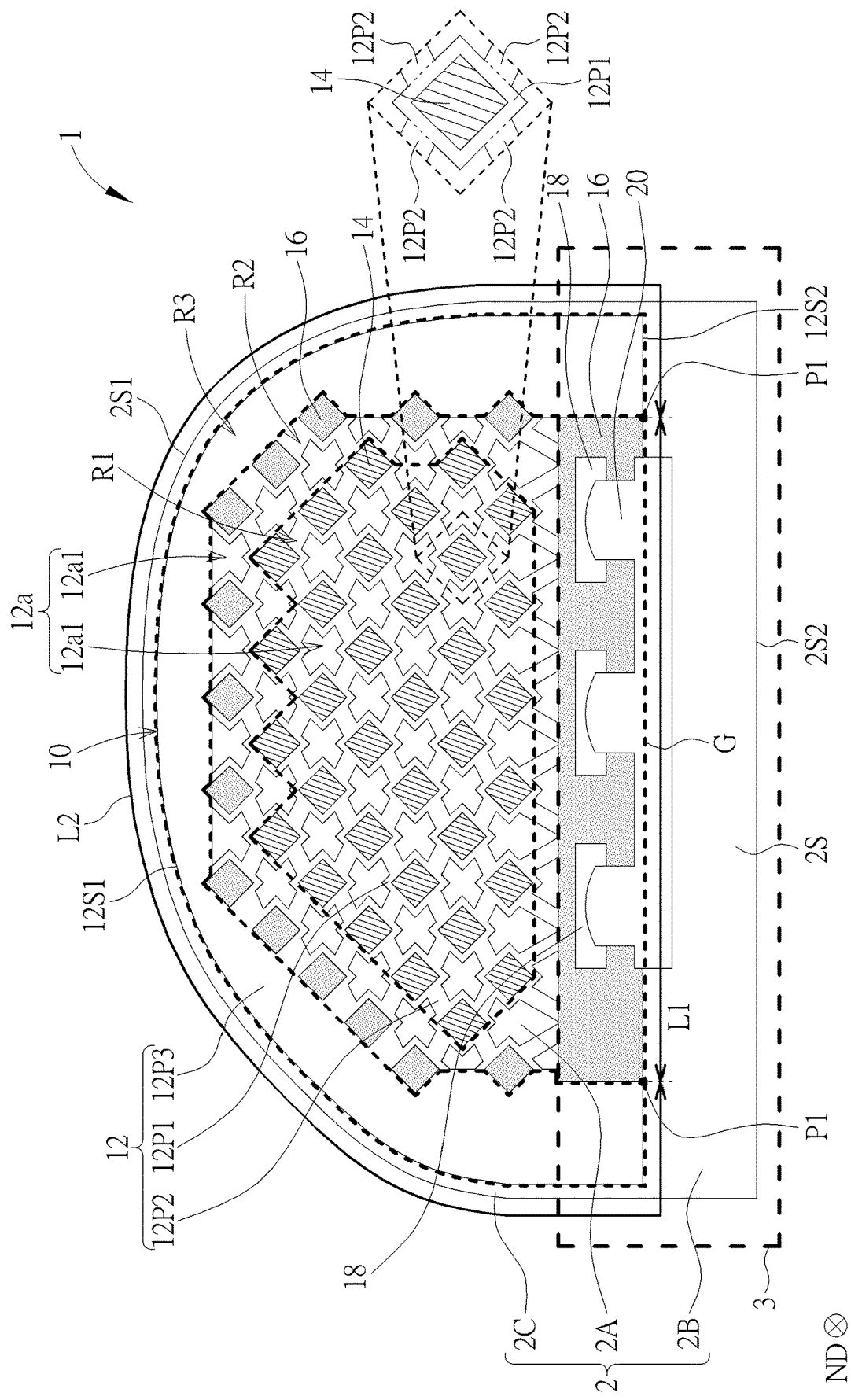
FIG. 2 is a schematic top view of a window according to some embodiments of the present disclosure.

FIG. 2 is a schematic top view of a window according to some embodiments of the present disclosure. As shown in FIG. 2, the window 1 may include a transparent substrate 2 and a display panel 10. The transparent substrate 2 may have a Gauss curvature that is not equal to zero, and the display panel 10 may be attached to the transparent substrate 2. The transparent substrate 2 may be, for example, the aforementioned transparent substrate 2 (as shown in FIG. 1), which has a curved surface 2S with a Gauss curvature that is not equal to zero, but not limited thereto. The window 1 in the following description will be a car window as an example. In the embodiment of FIG. 2, it is viewed from one side of the window 1, for example, viewed from a top view direction ND of the display panel 10. The transparent substrate 2 may include, for example, an outer edge 2S1 and an outer edge 2S2, but not limited thereto. In an embodiment, the outer edge 2S1 may be arc-shaped, and the outer edge 2S2 may be substantially straight, but not limited thereto. The two ends of the outer edge 2S1 may be connected to the two ends of the outer edge 2S2 to form the outer profile of the transparent substrate 2, but the window 1 of the present disclosure is not limited thereto. In some embodiments, the top view direction ND of the display panel 10 may be, for example, the normal direction of the tangent plane at any point on the curved surface 2S, but the present disclosure is not limited thereto. In some embodiments, the window 1 may include, for example, a window of a vehicle, a window of a building, or other windows with curved surfaces. The window 1 may be set in a window frame. In the embodiment of FIG. 2, the window frame may be a frame around the window 1 or at least a part of a door 3 of a vehicle, but not limited thereto.

In some embodiments, the transparent substrate 2 may include an exposed portion 2A, a shielded portion 2B, and an embedded portion 2C, but not limited thereto. When the window 1 is in a closed state, the exposed portion 2A may be a portion of the transparent substrate 2 that is not shielded by the door 3, and the shielded portion 2B and the embedded portion 2C may be portions of the transparent substrate 2 that are shielded by the door 3. For example, when the window 1 is in an open state, the shielded portion 2B may still be shielded by the door 3, and the embedded portion 2C may be exposed and will not be shielded by the door 3, but not limited thereto. The transparent substrate 2 of the present disclosure is not limited to the aforementioned description. In some embodiments, the exposed portion 2A, the shielded portion 2B, and the embedded portion 2C of the transparent substrate 2 may all have a curved surface 2S, but not limited thereto. In some embodiments, the exposed portion 2A and the embedded portion 2C may have a curved surface 2S, and the shielded portion 2B may have a flat surface, but not limited thereto.

Figure 4:
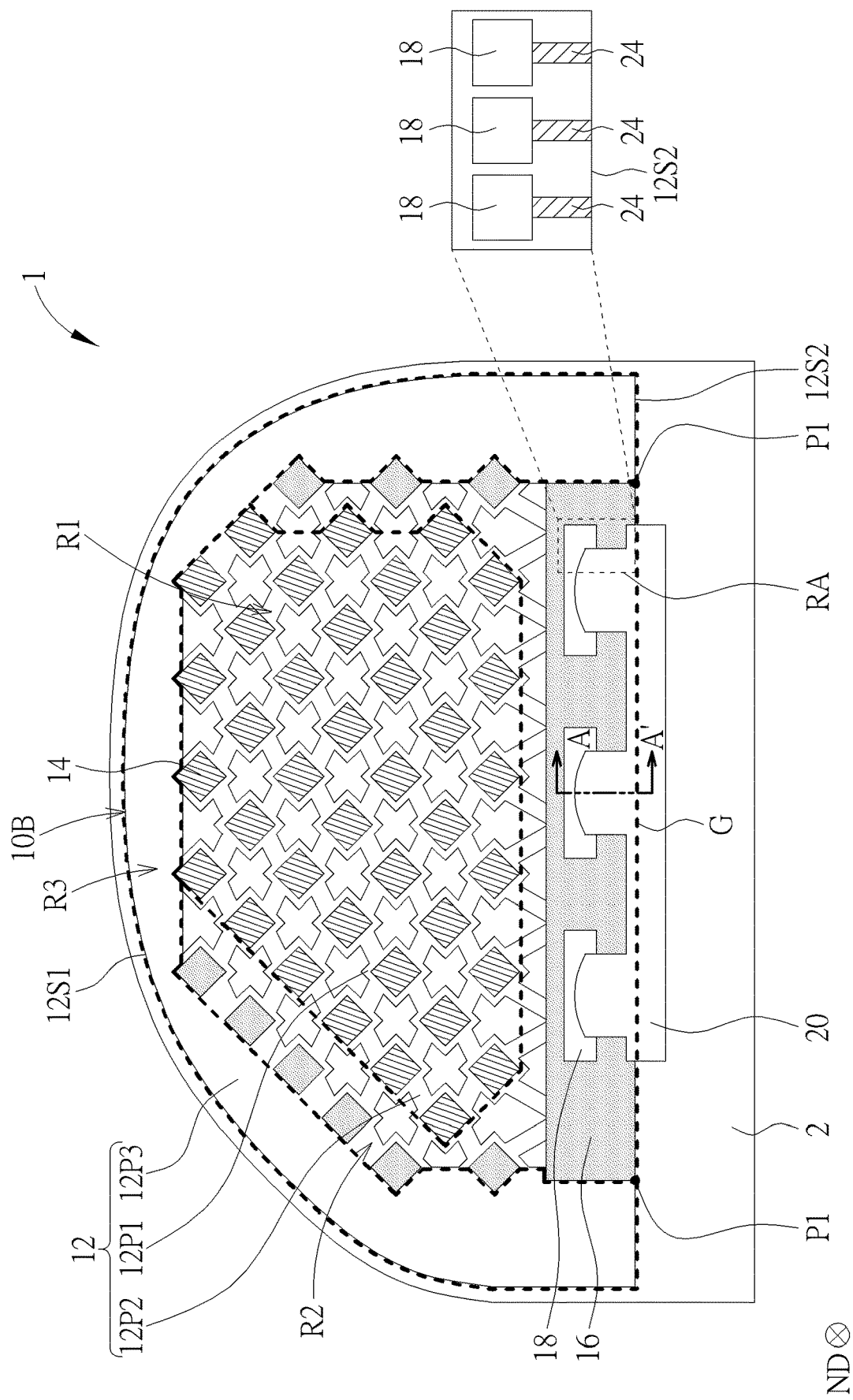
FIG. 4 is a schematic top view of a window according to some embodiments of the present disclosure.
Figure 15:
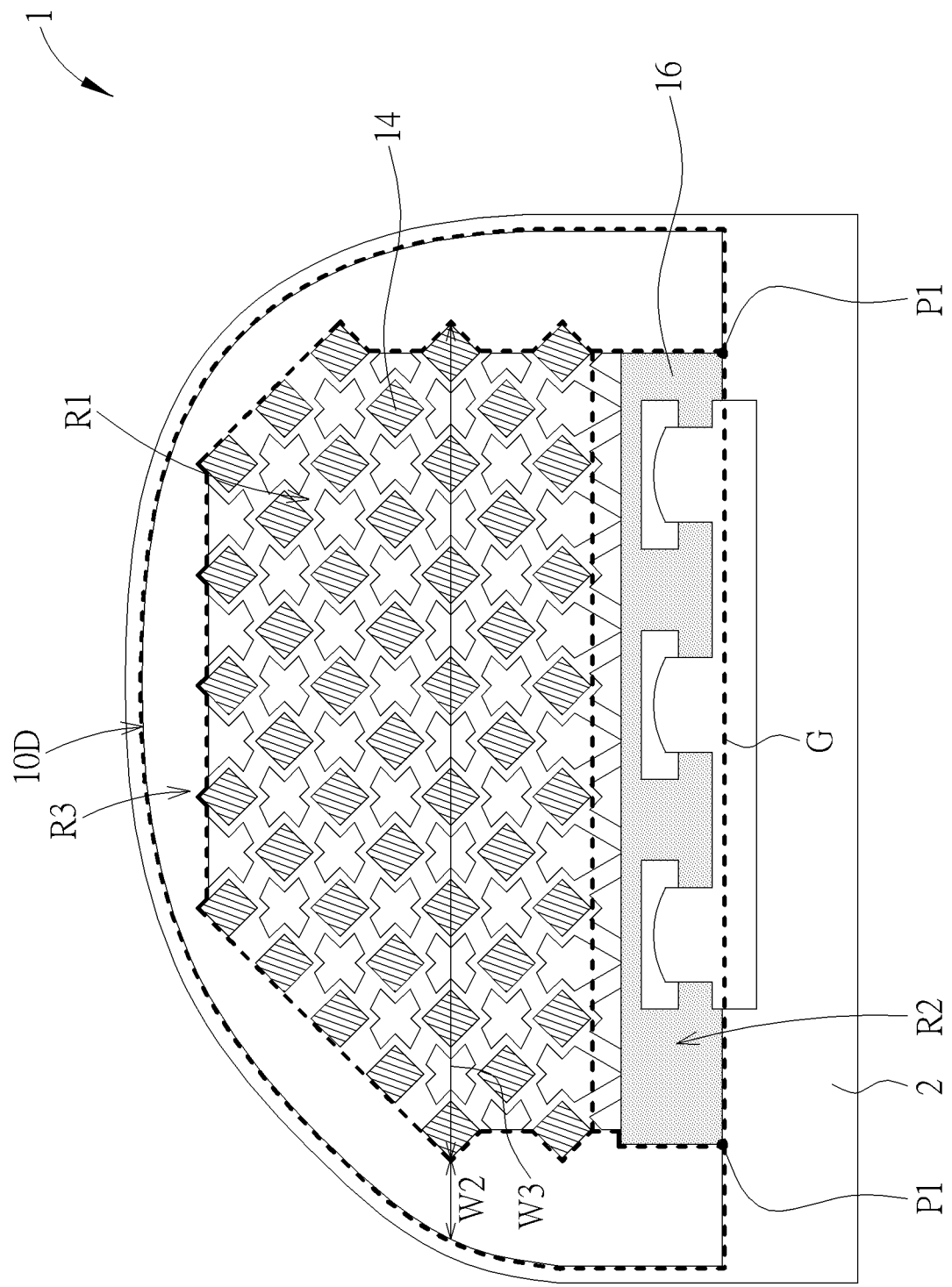
FIG. 15 is a schematic top view of a window according to some embodiments of the present disclosure.

The display panel 10 of the present disclosure may be a flexible display panel that may be bent toward at least two different directions, so as to conform to the curved surface 2S with a Gauss curvature not equal to zero. As shown in FIG. 2, the display panel 10 may include a flexible substrate 12, a plurality of light-emitting units 14 and a peripheral circuit 16, where the light-emitting units 14 and the peripheral circuit 16 may be disposed on the flexible substrate 12. In detail, the flexible substrate 12 may include a display region R1, a peripheral circuit region R2, and a dummy region R3. The peripheral circuit region R2 may be adjacent to the display region R1, and the dummy region R3 may be disposed outside the peripheral circuit region R2 and forms a gap G. In some embodiments, the dummy region R3 may surround the peripheral circuit region R2. For example, the dummy region R3 may be disposed at the periphery of the peripheral circuit region R2, and when the outer perimeter of the dummy region R3 occupies half or more of the outer perimeter of the peripheral circuit region R2, it may be regarded as the dummy region R3 surrounding the peripheral circuit region R2. The light-emitting units 14 may be disposed in the display region R1 to display images, and the peripheral circuit 16 may be disposed in the peripheral circuit region R2 to drive the light-emitting units 14. In the present disclosure, the display region R1 may be defined by the outer edges or the connection line of the outer corners of the outermost light-emitting units 14. The peripheral circuit region R2 may be defined as a region where the light-emitting units 14 are not disposed and the peripheral circuit 16 is disposed therein. For example, the peripheral circuit region R2 may be a region from the outer edge of a conductive component (for example, a wire or other conductive components) that is firstly met from the outer edge of the flexible substrate 12 inward, to the edge of the display region R1, but not limited thereto. The dummy region R3 may be defined as a region without the peripheral circuit 16 (such as wires, circuits, or components) and the light-emitting units 14, for example, a region without conductors and semiconductors on the flexible substrate 12. In other words, the dummy region R3 may be a region from the outer edge of a conductive component (such as a wire or other component with conductive characteristics) that is firstly met from the outer edge of the flexible substrate 12 inward, to the outer edge of the flexible substrate 12. In the embodiment of FIG. 2, the peripheral circuit region R2 may completely surround the display region R1, but not limited thereto. In some embodiments, as shown in FIG. 4, the peripheral circuit region R2 may partially surround the display region R1, so that a part of the display region R1 may be adjacent to the dummy region R3. Alternatively, as shown in FIG. 15, the peripheral circuit region R2 may be located on one side of the display region R1.

It should be noted that the dummy region R3 may be disposed between the peripheral circuit region R2 and the outer edge of the flexible substrate 12, and/or between the display region R1 and the outer edge of the flexible substrate 12. Therefore, when attaching the display panel 10 to the transparent substrate 2 or cutting the display panel 10, the dummy region R3 of the flexible substrate 12 may provide a buffer for attaching or cutting, so as to reduce the damages of the light-emitting units 14 and the peripheral circuit 16 which are caused by being adjacent to the outer edge of the transparent substrate 2 or located in the folds. In addition, the dummy region R3 of the flexible substrate 12 may also reduce the influence of cracks at the outer edge of the flexible substrate 12 upon the light-emitting units 14 and the peripheral circuit 16.

Figure 18:
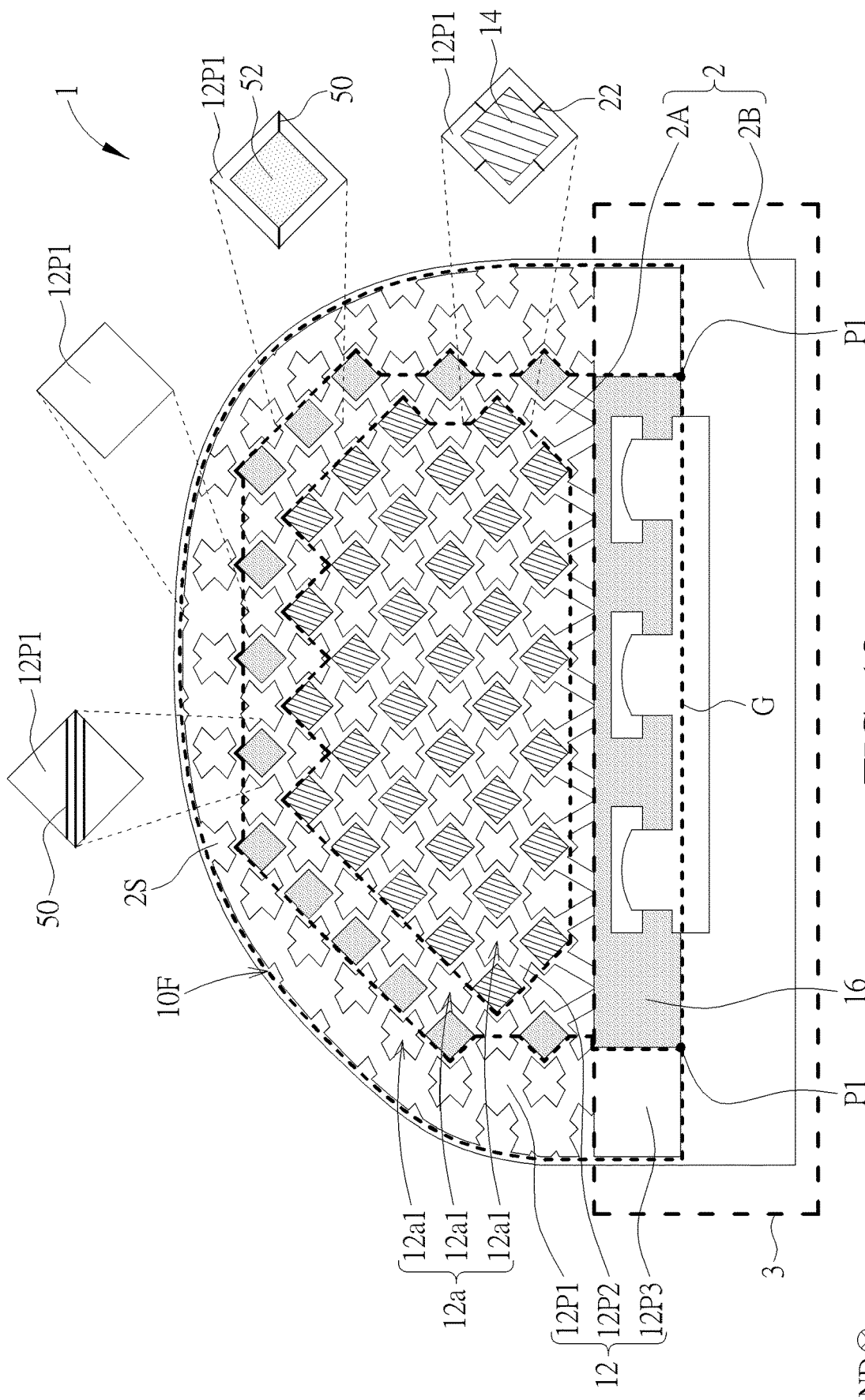
FIG. 18 is a schematic top view of a window according to some embodiments of the present disclosure.

As shown in FIG. 2, the flexible substrate 12 may have a patterned structure to reduce folds or creases caused by attaching the display panel 10 thereto. For example, the flexible substrate 12 may include an opening 12a in the display region R1 and/or the peripheral circuit region R2. In detail, the flexible substrate 12 may include a plurality of sub-openings 12a1 disposed in the display region R1 and the peripheral circuit region R2, and the sub-openings 12a1 may be holes penetrating the flexible substrate 12, but not limited thereto. In the present disclosure, the openings 12a may include a plurality of sub-openings 12a1. Through the design of the openings 12a, the degree of bending the display panel 10 toward at least two directions at the same time may be increased, and folds or creases are less likely to be produced. Therefore, when the display panel 10 is directly attached to the curved surface 2S that has a Gauss curvature of not zero and is bent toward at least two different directions at the same time, the display panel 10 may substantially conform to the curved surface 2S (especially the curved surface 2S whose Gauss curvature is not zero). In the embodiment of FIG. 2, the flexible substrate 12 in the dummy region R3 may not have an opening, thereby increasing the contact area between the flexible substrate 12 and the curved surface 2S to help attaching the display panel 10 to the curved surface 2S, but not limited thereto. In some embodiments, as shown in FIG. 18, the flexible substrate 12 in the dummy region R3 may also have an opening 12a.

Figure 5:
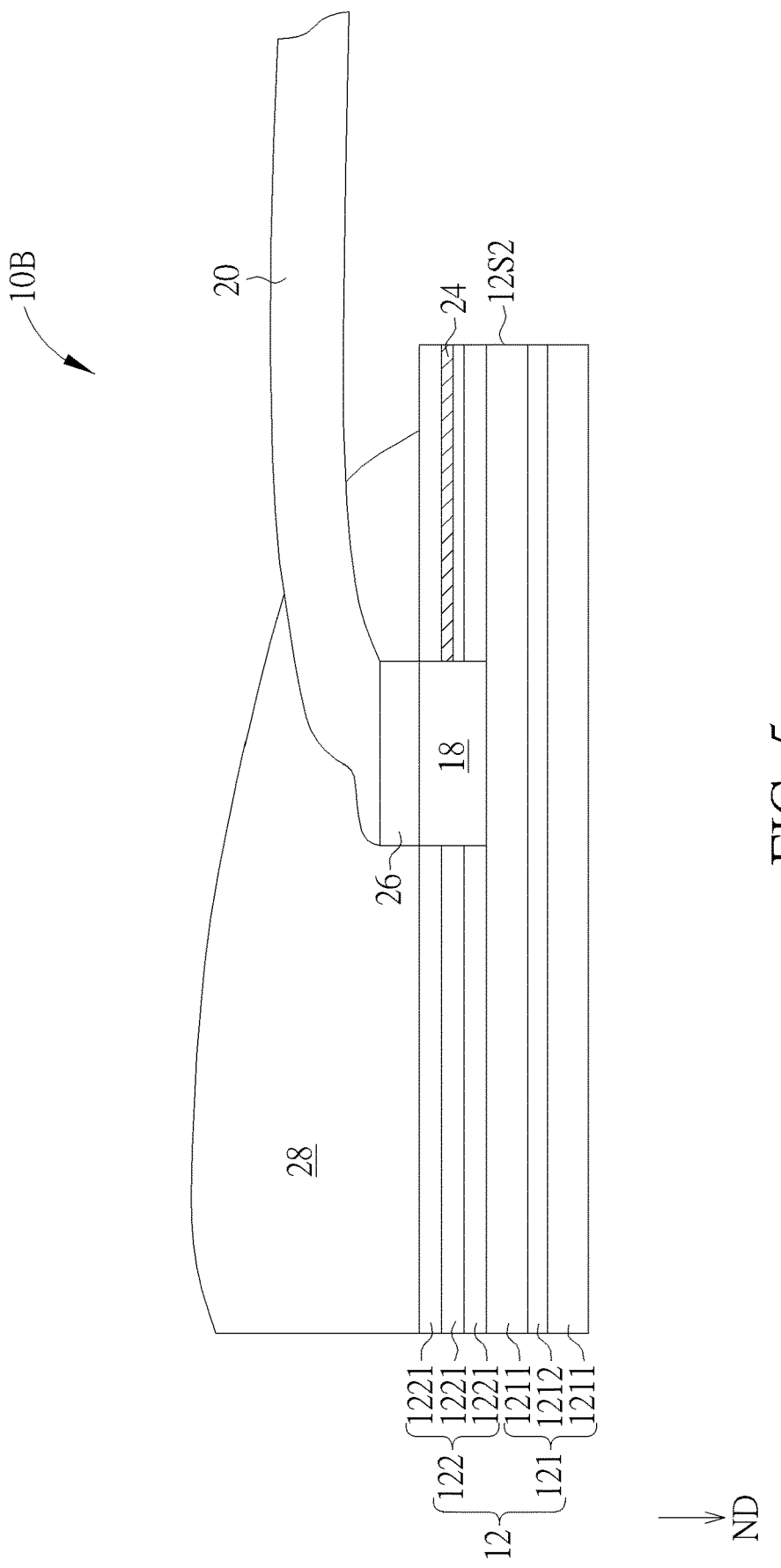
FIG. 5 is a schematic cross-sectional view of a display panel along the cross-sectional line A-A' of FIG. 4.

The flexible substrate 12 may include, for example, a stretchable substrate, a bendable substrate, or a foldable substrate. The stretchable substrate may include, for example, a stretchable or malleable substrate. In some embodiments, if the flexible substrate 12 conforms to a curved surface (for example, a curved surface 2S with a Gauss curvature of not zero) by deformation or other suitable methods, it may be regarded as a stretchable substrate. In some embodiments, as shown in FIG. 5, the flexible substrate 12 may include a substrate 121 and a buffer layer 122, where the buffer layer 122 may be disposed between the substrate 121 and the light-emitting units 14, and between the substrate 121 and the peripheral circuit 16. In the present disclosure, the flexible substrate 12 with openings may mean that the sub-openings 12a1 may penetrate through the buffer layer 122 and the substrate 121. The detailed structures of the substrate 121 and the buffer layer 122 will be described in the following embodiments, and the following embodiments of the substrate 121 and the buffer layer 122 may be applied to the embodiment of FIG. 2.

Figure 3:
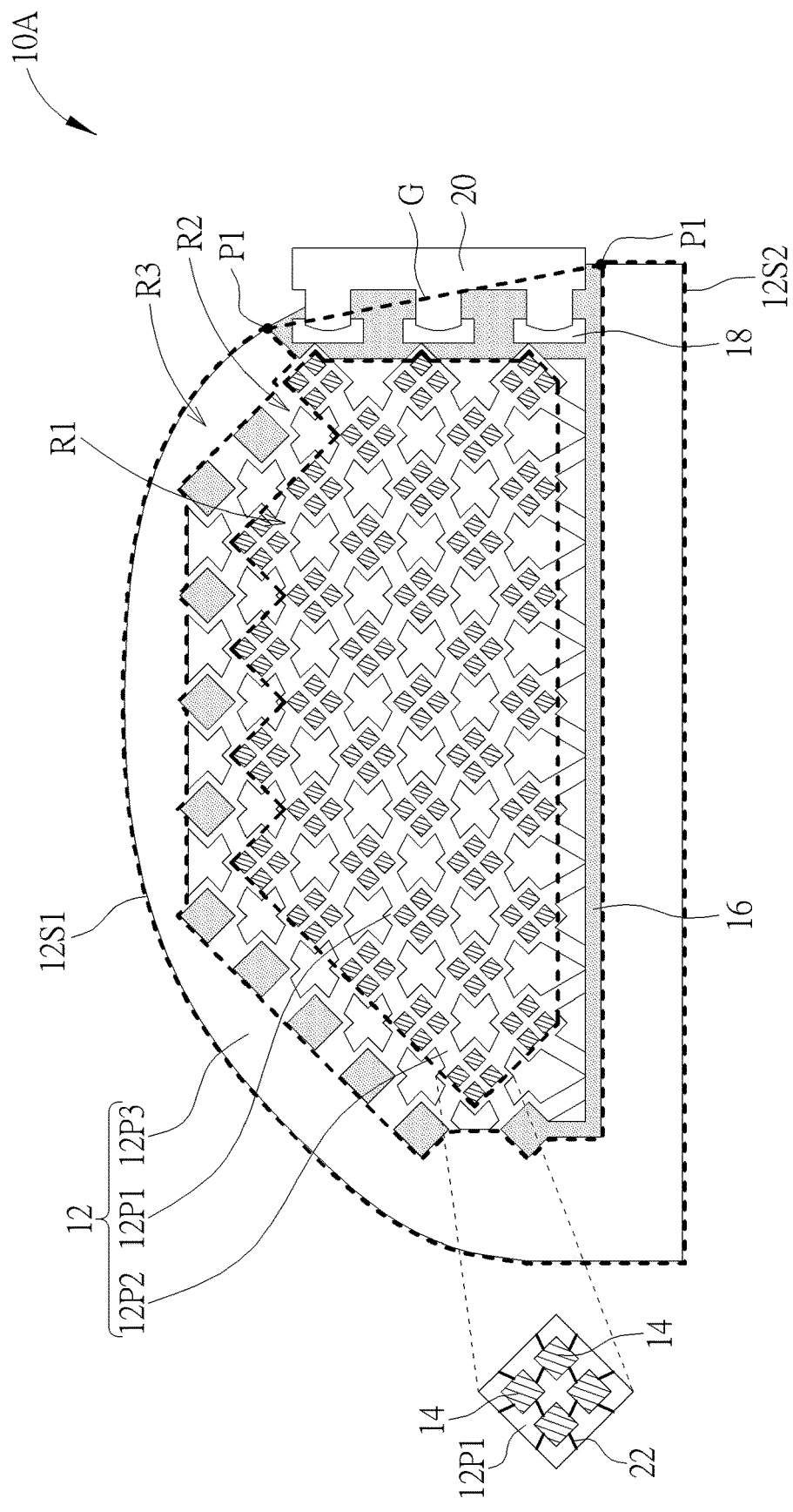
FIG. 3 is a schematic top view of a display panel according to some embodiments of the present disclosure.

Furthermore, in some embodiments, as shown in FIG. 2, the flexible substrate 12 may include a plurality of island-shaped portions 12P1, a plurality of connecting portions 12P2, and a sheet-shaped portion 12P3. The width of the connecting portion 12P2 in the direction perpendicular to its extending direction may be less than a width of one side of the island-shaped portion 12P1, and two adjacent island-shaped portions 12P1 may be connected to each other by the connecting portion 12P2, so that the island-shaped portions 12P1 and the connecting portions 12P2 may be connected to form a grid-like shape. Therefore, the island-shaped portions 12P1 and the connecting portions 12P2 may form a plurality of sub-openings 12a1. For example, the sheet-shaped portion 12P3 may be a sheet structure disposed on the periphery of the island-shaped portions 12P1 and the connecting portions 12P2. In some embodiments, the region enclosed by the smallest distance between two adjacent openings 12a1 may be the connecting portion 12P2. In other embodiments, a connection line of two adjacent corners of the island-shaped portion 12P1 may be as the dividing line between the island-shaped portion 12P1 and the connecting portion 12P2. In some embodiments, the maximum thickness of the connecting portion 12P2 in the top view direction ND may be less than the maximum thickness of the island-shaped portion 12P1 in the top view direction ND, but not limited thereto. In the embodiment of FIG. 2, the island-shaped portions 12P1 and the connecting portions 12P2 may be disposed in the display region R1 and the peripheral circuit region R2, and the sheet-shaped portion 12P3 may be at least partially disposed in the dummy region R3, but not limited thereto. In FIG. 2, the sheet-shaped portion 12P3 may be connected to the outermost island-shaped portions 12P1 and/or the outermost connecting portions 12P2, but not limited thereto. As shown in FIG. 2, one light-emitting unit 14 may be disposed on one island-shaped portion 12P1, but the present disclosure is not limited thereto. In some embodiments, a plurality of light-emitting units 14 may be disposed on one island-shaped portion 12P1, as shown in FIG. 3.

In some embodiments, as shown in FIG. 2, the flexible substrate 12 may have an outer edge 12S1 and an outer edge 12S2, where the outer edge 12S1 may be substantially arc-shaped and disposed along the outer edge 2S1 of the transparent substrate 2, and the outer edge 12S2 may be substantially straight and disposed along the outer edge 2S2 of the transparent substrate 2.

The light-emitting units 14 may include a light-emitting diode, a fluorescent material, a phosphor material, quantum dots (QD), other suitable display medium, or a combination thereof, but not limited thereto, which are capable of generating light. In some embodiments, the display panel 10 may further include transistors (not shown) and wires (for example, the wires 22 shown in FIG. 3) that are electrically connected to the light-emitting units 14, the transistors and the peripheral circuit 16. The transistors and the wires may be disposed in the display region R1. The wires may be signal lines, and the signal lines may include, for example, data lines, scan lines, common lines, power lines, and/or other suitable signal lines, but not limited thereto.

The peripheral circuit 16 may include, for example, wires, circuits, conductive pads 18 and/or other suitable conductive components. In some embodiments, the wires may be traces, and the traces may include, for example, a line electrically connected to a signal line, a circuit, a conductive pad 18 and/or other suitable conductive components, such as a wire 50 shown in FIG. 18. The conductive pad 18 may be, for example, a contact pad. The wires may be disposed on, for example, the island-shaped portion 12P1, the connecting portion 12P2, and the sheet-shaped portion 12P3 located in the peripheral circuit region R2. In some embodiments, the wires may also optionally include a crack sensing line (not shown), which is a line in the peripheral circuit 16 that is closest to the outer edge of the flexible substrate 12. Through the crack sensing line, whether the crack sensing line is open may be detected at any time to determine whether the crack extends into the peripheral circuit region R2 or the display region R1. A circuit may be disposed on, for example, the island-shaped portion 12P1, and may be electrically connected to the light-emitting units 14 and/or the conductive pads 18 through wires. The circuit may include, for example, a gate drive circuit, a source drive circuit, a multiplexer (Mux), a demultiplexer (DeMux) and/or other suitable circuits, such as the circuit 52 shown in FIG. 18, where the gate drive circuit may be, for example, a gate driver on panel (GOP). The conductive pad 18 may be disposed on, for example, the sheet-shaped portion 12P3 in the peripheral circuit region R2, and used to electrically connect the light-emitting units 14 to a control chip or other suitable components. A part of the peripheral circuit 16 may be disposed on the periphery of the display region R1. In the embodiment of FIG. 2, the peripheral circuit 16 may surround the display region R1, but not limited thereto.

In the present disclosure, the gap G may be defined as the connection line of two points P1 on the inner side of the dummy region R3 (for example, the boundary between the dummy region R3 and the peripheral circuit region R2) that are farthest from the light-emitting units 14. In this embodiment, the peripheral circuit 16 may extend to the outer edge of the flexible substrate 12 at the gap G to be further electrically connected to other conductive components. In some embodiments, the length of the gap G may be less than the perimeter of the dummy region R3.

In the embodiment of FIG. 2, the conductive pads 18 of the peripheral circuit 16 may be disposed adjacent to the gap G, so that the conductive pads 18 of the peripheral circuit 16 may be electrically connected to other circuits through the gap G.

In the embodiment of FIG. 2, the display panel 10 may include a circuit board 20 which is electrically connected to the peripheral circuit 16 through the gap G. In detail, the circuit board 20 may be electrically connected to and bonded to the conductive pads 18 of the peripheral circuit 16 through a conductive glue (for example, the conductive glue 26 as shown in FIG. 5), but not limited thereto. The circuit board 20 may include, for example, a flexible circuit board, a rigid circuit board, or a combination thereof. In some embodiments, a control chip may optionally be disposed on the circuit board 20, but not limited thereto. In some embodiments, the display panel 10 may include, for example, a control chip or a control circuit which is disposed on the conductive pads 18 of the peripheral circuit 16. It should be noted that the circuit board 20 and a part of the peripheral circuit 16 may be disposed on the shielded portion 2B of the transparent substrate 2 and may be shielded by the door 3 of a vehicle. For example, the circuit board 20 and at least a part of the peripheral circuit 16 may overlap the door 3 in the top view direction ND of the display panel 10.

In addition, as shown in FIG. 2, the gap G may have a length L1, and the dummy region R3 may have a perimeter L2. The perimeter L2 of the dummy region R3 may be defined as a distance from one point P1 along the outer edge of the dummy region R3 to another point P1. For example, the length L1 of the gap G may be less than the perimeter L2 of the dummy region R3 (L1<L2). Alternatively, the length L1 of the gap G may be less than half of the perimeter L2 of the dummy region R3 (L1<0.5×L2), or the ratio of the length L1 of the gap G to the perimeter L2 may be ranged from 0.1 to 0.4 (0.1×L2<L1≤0.4×L2). It should be noted that when the gap G is too small, the density of the wires electrically connected to the conductive pads 18 in the peripheral circuit 16 may be too high, so that the formed wires are likely to be a short-circuit due to incomplete etching or the external particles. When the gap G is too large, the dummy region R3 may not provide enough space, which increases the risk of damage to the peripheral circuit 16 when attaching and/or cutting the display panel 10. Therefore, through the aforementioned relationship between the length L1 of the gap G and the perimeter L2, the gap G and the dummy region R3 may have appropriate dimensions, thereby reducing the short circuit of the peripheral circuit 16 or the damage of the peripheral circuit 16 during attaching or cutting. In some embodiments, the perimeter of the dummy region R3 may be regarded as the perimeter L2 of the dummy region R3, and the perimeter L2 may not include a part of the dummy region R3 connected to the display region R1 and a part of the dummy region R3 connected to the peripheral circuit region R2. In the embodiment of FIG. 2, the gap G may correspond to a part of the outer edge 12S2 of the flexible substrate 12, but not limited thereto. In other words, in the top view direction ND, the gap G and the outer edge 12S2 may partially overlap. In some embodiments, the gap G may also correspond to a part of the outer edge 12S1 of the flexible substrate 12. In other words, in the top view direction ND, the gap G and the outer edge 12S1 may partially overlap.

The display panels and windows of the present disclosure are not limited to the aforementioned embodiments. Variant embodiments and other embodiments of the present disclosure are further mentioned in the following description. In order to facilitate the comparison of different embodiments and simplify the description, the same components will be labeled with the same symbols in the following description. The following description will describe the differences between the different embodiments in detail, and the same features will not be repeated.

FIG. 3 is a schematic top view of a display panel according to some embodiments of the present disclosure. As shown in FIG. 3, the gap G may correspond to at least a part of the peripheral circuit region R2. For example, according to the design requirements of the vehicle door, for example, the door handle may correspond to the outer edge 12S1 of the flexible substrate 12, and the door may be lifted upwards, or have other suitable designs, or other application requirements. The gap G corresponding to the peripheral circuit 16 may not be limited to be located at the outer edge 12S2 of the flexible substrate 12, at the outer edge 12S1, or at the peripheral circuit region R2.

In some embodiments, as shown in FIG. 3, a plurality of light-emitting units 14 may be disposed on one island-shaped portion 12P1, but not limited thereto. This case may be applied to any of the aforementioned or the following embodiments. In some embodiments, the display panel 10A may further include wires 22 electrically connected to the light-emitting units 14, but not limited thereto.

FIG. 4 is a schematic top view of a window according to some embodiments of the present disclosure, and FIG. 5 is a schematic cross-sectional view of a display panel taken along a cross-sectional line A-A' of FIG. 4. In FIG. 4, the right portion is an enlarged schematic diagram of a region RA, mainly showing the conductive pads 18 and the wires 24, and the circuit board 20 is omitted, but not limited thereto. As shown in FIG. 4, in some embodiments, the peripheral circuit 16 of the display panel 10B may further include wires 24 which extend to the outer edge of the flexible substrate 12, for example, extend to the outer edge 12S2 of the flexible substrate 12, but not limited thereto. In some embodiments, when the gap G is located at the outer edge 12S1, the wires 24 may extend to the outer edge 12S1 of the flexible substrate 12. In detail, the wires 24 may be electrically connected to the conductive pads 18 and extend to the outer edge of the display panel 10B, so that the ends of the wires 24 may be exposed and the static charges therein may be discharged. Therefore, the wires 24 may be used as an electrostatic protection component. Through the installation of the wires 24, the circuit board 20 or the components electrically connected to the conductive pads 18 may be protected from electrostatic damage. The wire 24 may include a semiconductor, a conductor, or a combination thereof. The semiconductor may include, for example, polysilicon, oxide semiconductor, or other suitable semiconductors. The conductor may include, for example, a metal, a transparent conductive compound (e.g., indium tin oxide), or a combination thereof. When the wire 24 includes a semiconductor, since the semiconductor is not easily oxidized by moisture or oxygen, a good electrostatic protection effect may be achieved.

As shown in FIG. 5, in an embodiment, the flexible substrate 12 may include a substrate 121 and a buffer layer 122 stacked in sequence. Although not shown in FIG. 5, the substrate 121 and the buffer layer 122 may extend into the display region R1 and the dummy region R3. In some embodiments, the substrate 121 may include, for example, a single-layered structure or a multi-layered structure. In the case where the substrate 121 includes a multi-layered structure, the substrate 121 may include, for example, a stack of a flexible substrate material 1211, an inorganic insulating layer 1212, and a flexible substrate material 1211, where the inorganic insulating layer 1212 is disposed between the flexible substrate materials 1211, thereby improving the ability of the flexible substrate 12 to block moisture and oxygen, but not limited thereto. For example, the material of the substrate 121 may include a suitable transparent material, a translucent material, or an opaque substrate material, but not limited thereto. In some embodiments, the flexible substrate material 1211 may include, for example, polycarbonate (PC), polyimide (PI), polypropylene (PP), or polyethylene terephthalate (PET), other suitable materials or a combination thereof, but not limited thereto. The inorganic insulating layer 1212 may include, for example, silicon oxide, silicon nitride, silicon oxynitride, a combination thereof, and/or other suitable inorganic insulating materials.

The buffer layer 122 may include a single-layered structure or a multi-layered structure. In some embodiments, in the case of the buffer layer 122 including the multi-layered structure, the buffer layer 122 may include a stack of multiple inorganic insulating layers 1221 to improve the ability of the flexible substrate 12 to block moisture and oxygen, but not limited thereto. The number of inorganic insulating layers 1221 in the buffer layer 122 may be adjusted according to requirements. In some embodiments, the inorganic insulating layers 1221 of the buffer layer 122 may include, for example, silicon oxide, silicon nitride, silicon oxynitride, a combination thereof, and/or other suitable inorganic insulating materials. In some embodiments, the buffer layer 122 may also include a stack of an inorganic insulating layer 1221, an organic insulating layer and an inorganic insulating layer 1221, but not limited thereto. In the embodiment of FIG. 5, the conductive pads 18 may be disposed in holes of the buffer layer 122, but not limited thereto. In some embodiments, as shown in FIG. 5, the wires 24 may be disposed between the inorganic insulating layers 1221 of the buffer layer 122, but not limited thereto. In some embodiments, the buffer layer 122 may be omitted, but not limited thereto.

It should be noted that because the flexible substrate 12 is patterned, the ability of the flexible substrate 12 to block moisture and oxygen may be reduced. Therefore, the multi-layered buffer layer 122 and the multi-layered substrate 121 may improve the ability of the flexible substrate 12 to block moisture and oxygen, thereby improving the reliability of the display panel 1.

As shown in FIG. 5, the circuit board 20 may be electrically connected to the conductive pads 18 through the conductive glue 26. The conductive glue 26 may include, for example, an anisotropic conductive film (ACF). In some embodiments, the display panel 10B further includes a protection layer 28 which is disposed on the flexible substrate 12, the conductive pads 18, and a part of the circuit board 20 to protect the peripheral circuit 16, the light-emitting units 14, and the bonding of the circuit board 20 and the conductive pads 18. The protection layer 28 may include, for example, organic materials or other suitable materials.

In some embodiments, as shown in FIG. 4, the display region R1 may be adjacent to the dummy region R3. For example, the peripheral circuit region R2 may partially surround the display region R1. This placement may be applied to any of the aforementioned or the following embodiments. In some embodiments, the peripheral circuit region R2 of the embodiment of FIG. 4 may also surround the display region R1 or be located on one side of the display region R1.

Figure 6:
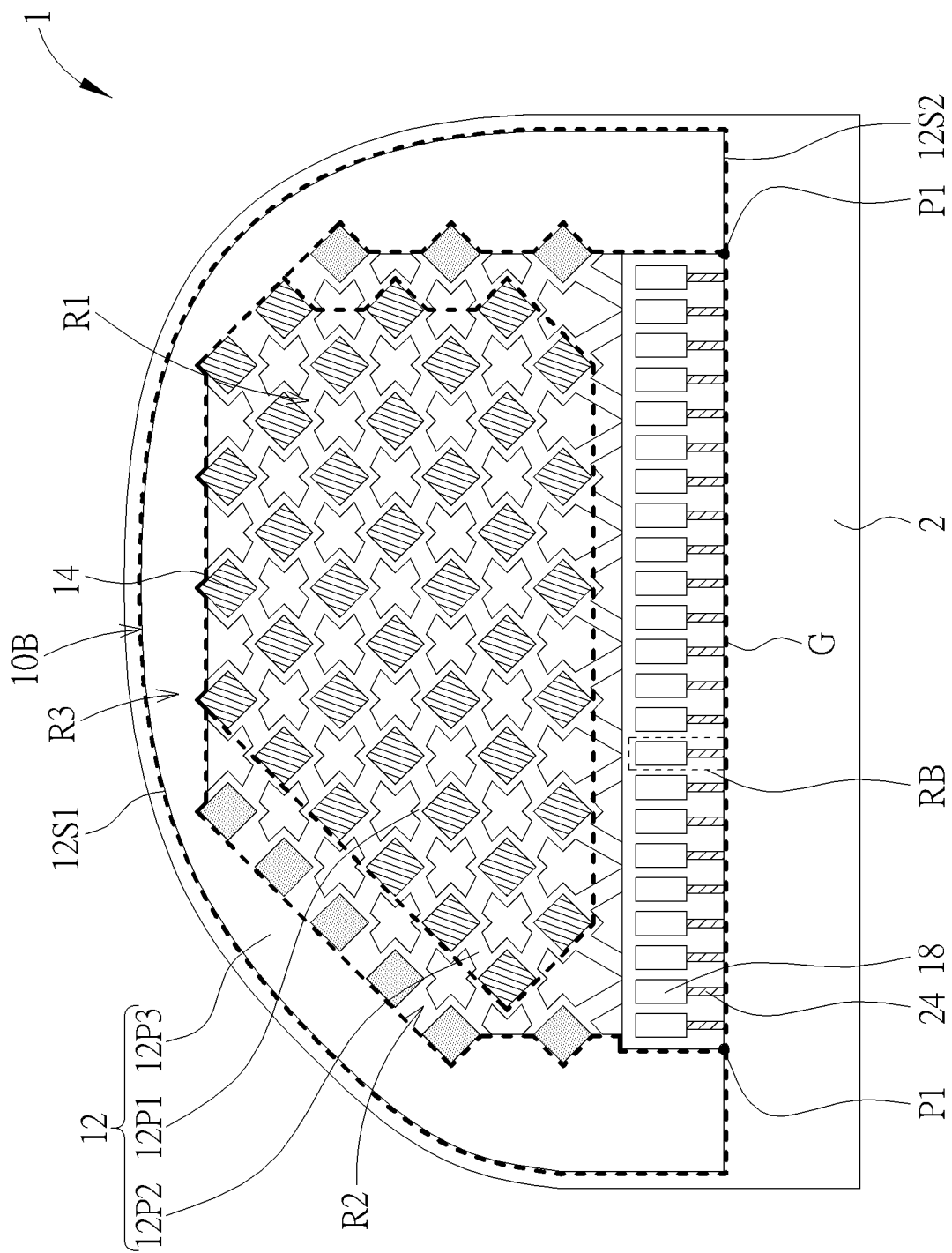
FIG. 6 is a schematic top view of a window according to some embodiments of the present disclosure.
Figure 7:
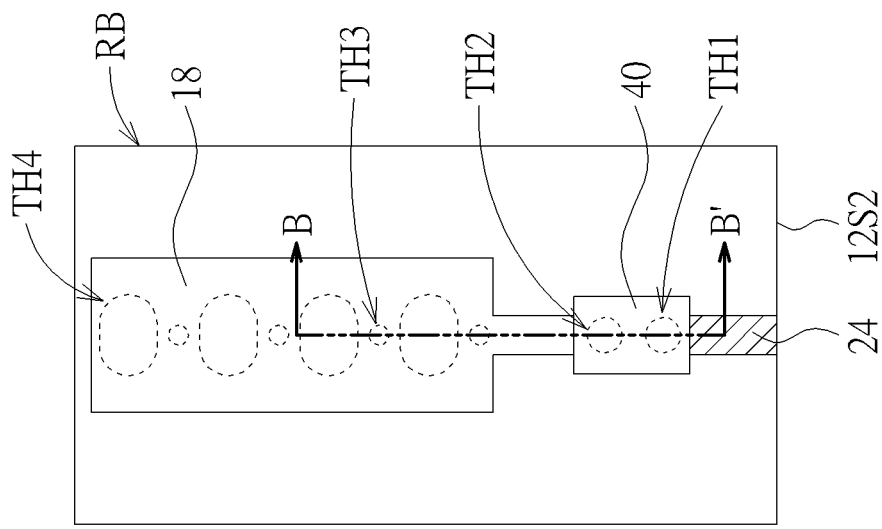
FIG. 7 is an enlarged schematic diagram of a region RB in FIG. 6.
Figure 8:
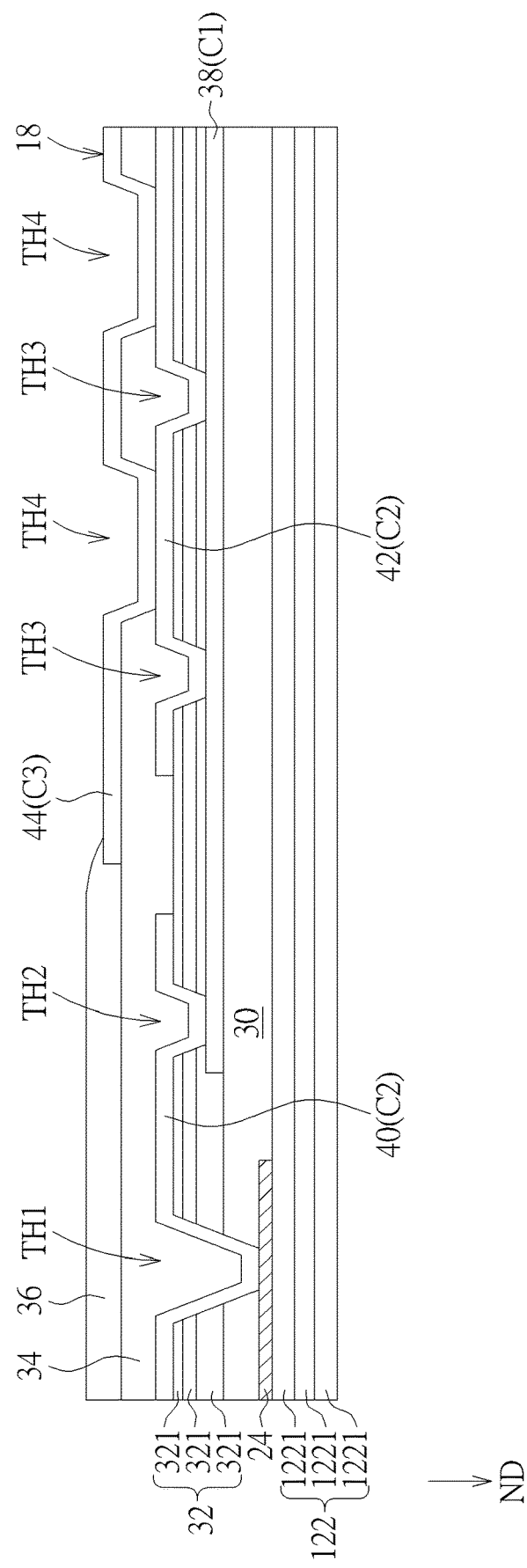
FIG. 8 is a schematic cross-sectional view taken along the cross-sectional line B-B' of FIG. 7.

FIG. 6 is a schematic top view of a window according to some embodiments of the present disclosure. FIG. 7 is an enlarged schematic view of a region RB in FIG. 6. FIG. 8 is a schematic cross-sectional view taken along the cross-sectional line B-B' of FIG. 7. In order to clearly illustrate the top view structure of the conductive pads 18 and the wires 24 of the display panel 10B, the circuit board 20 is omitted in FIG. 6, and the region RB corresponds to a single conductive pad 18 and a single wire 24, but not limited thereto. In addition, the substrate 121 is omitted in FIG. 8 to clearly illustrate the cross-sectional structure of an electrical connection of the conductive pad 18 and the wire 24, but the present disclosure is not limited thereto. In the embodiment of FIG. 6, the display panel 10B may include a plurality of conductive pads 18 and a plurality of wires 24, and the conductive pads 18 may be electrically connected to the corresponding wires 24, but the present disclosure is not limited thereto. As shown in FIG. 7 and FIG. 8, in one embodiment, in addition to the buffer layer 122 and the wires 24, the display panel 10B may also include an insulating layer 30, a first conductive layer C1, an insulating layer 32, a second conductive layer C2, an insulating layer 34, a third conductive layer C3 and/or a flattening layer 36, but not limited thereto. In the embodiment of FIG. 7 and FIG. 8, the wire 24 may be disposed on the buffer layer 122. For example, the wire 24 and the semiconductor layer of the transistor in the display region R1 of the display panel 10B may include the same material, be formed by the same process, or be formed of the same layer. The insulating layer 30 may be disposed on the wire 24 and the buffer layer 122. The first conductive layer C1 may include an electrode 38 and be disposed on the insulating layer 30. The insulating layer 32 may be disposed on the first conductive layer C1. The insulating layer 30 and the insulating layer 32 may have a hole TH1 corresponding to the wire 24, and the insulating layer 32 may have a hole TH2 and a plurality of holes TH3. The second conductive layer C2 is formed on the insulating layer 32 and may include a connecting line 40 and an electrode 42. The connecting line 40 may extend into the hole TH1 and the hole TH2 to be electrically connected to the wire 24 and the electrode 38, so that the wire 24 and the electrode 38 may be electrically connected to each other. The electrode 42 may extend into the holes TH3 to be electrically connected to the electrode 38. The insulating layer 34 is disposed on the second conductive layer C2 and has a hole TH4 corresponding to the electrode 38. The third conductive layer C3 is formed on the insulating layer 34 and includes an electrode 44. The electrode 44 may extend into the hole TH4 to be electrically connected to the electrode 42. Therefore, the electrode 44 may be electrically connected to the corresponding wire 24 through the electrode 42, the electrode 38 and the connecting line 40. In FIG. 8, the conductive pad 18 may be, for example, a multi-layered structure, and includes the electrode 44, the electrode 42 and the electrode 38, but the present disclosure is not limited thereto. Through the connecting line 40, the conductive pad 18 may be electrically connected to the corresponding wire 24, and through the connecting line 40, the static charges may be guided to the outer edge of the display panel 10B through the wire 24, thereby reducing the damage of the display panel 10B by the static electricity. It should be noted that since the electrode 44 extends into the hole TH4, it may have an undulating upper surface. When the circuit board is bonded to the conductive pad 18 through the conductive glue, the undulating upper surface of the electrode 44 may help increasing the bonding area of the electrode 44 and the circuit board, thereby improving the degree of bonding between the conductive pad 18 and the circuit board.

For example, the first conductive layer C1, the second conductive layer C2, and the third conductive layer C3 may each include a metal, a transparent conductive compound, other suitable conductive materials, or a combination thereof, but not limited thereto. The metal may include, for example, molybdenum (Mo), aluminum (Al), titanium (Ti), copper (Cu), other suitable metals, or a combination thereof. The transparent conductive compound may include, for example, indium tin oxide (ITO), indium zinc oxide (IZO) or other suitable transparent conductive materials. The first conductive layer C1, the second conductive layer C2, and the third conductive layer C3 may be, for example, a single-layered structure or a multi-layered structure. The multi-layered structure may include, for example, a stack of molybdenum/aluminum/molybdenum, a stack of titanium/aluminum/titanium, a stack of titanium/aluminum/molybdenum, a stack of titanium/copper/titanium, or other suitable metal stacked combinations.

The insulating layer 30, the insulating layer 32, the insulating layer 34, and the flattening layer 36 may include insulating materials. For example, the insulating materials may include inorganic insulating materials or organic insulating materials. The inorganic insulating material may include, for example, silicon oxide, silicon nitride, silicon oxynitride, or other suitable inorganic materials. In some embodiments, the insulating layer 32 may include a multi-layered structure, for example, including multiple insulating layers 321. In some embodiments, the two insulating layers 321 adjacent to each other may include different insulating materials, such as silicon oxide and silicon nitride, but not limited thereto.

Figure 9:
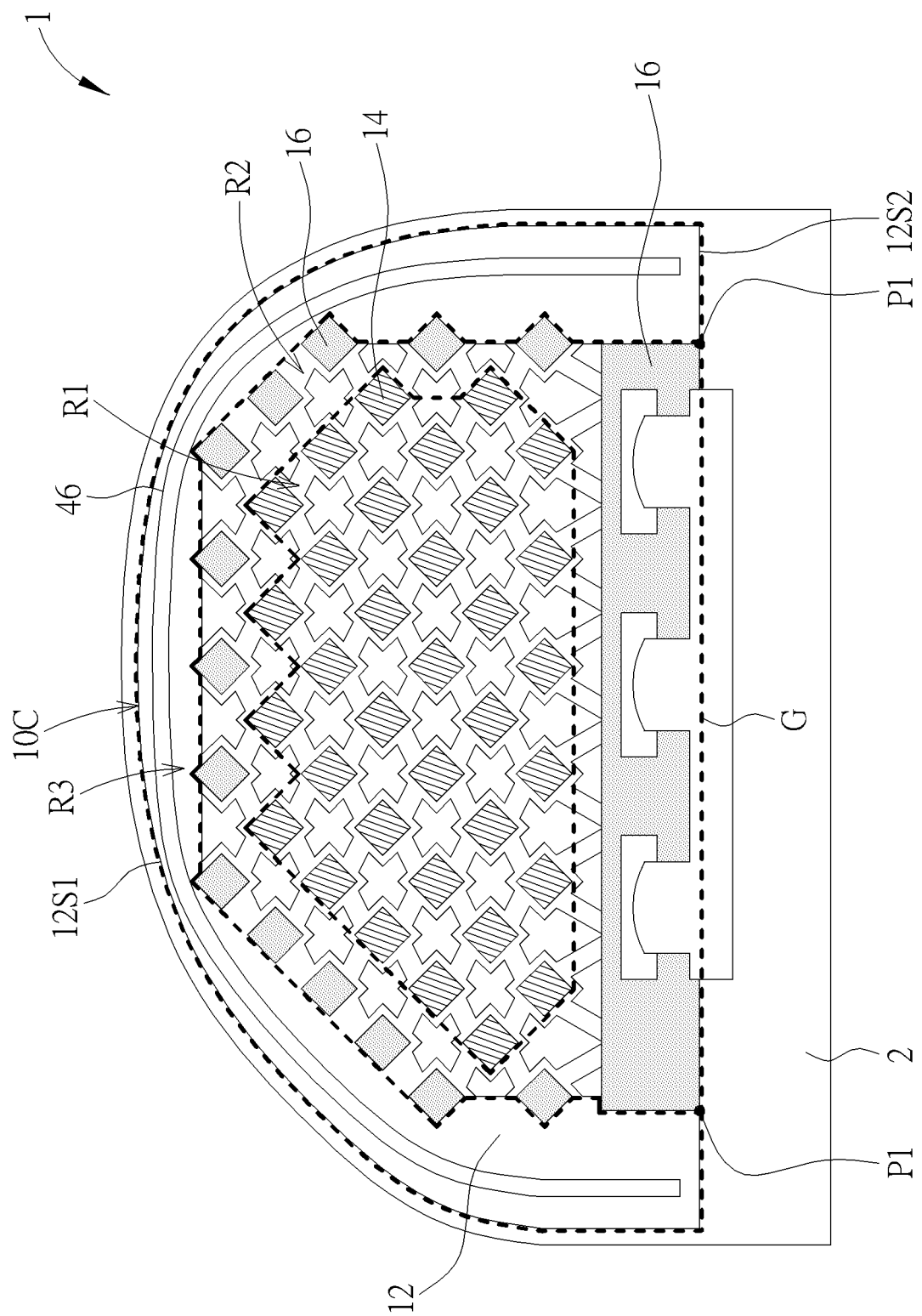
FIG. 9 is a schematic top view of a window according to some embodiments of the present disclosure.

FIG. 9 is a schematic top view of a window according to some embodiments of the present disclosure. As shown in FIG. 9, in some embodiments, the flexible substrate 12 may optionally include a crack blocking structure 46 disposed in the dummy region R3 to prevent the side cracks of the flexible substrate 12 from further extending to the peripheral circuit region R2 and the display region R1, thereby reducing the damage of the display panel 10C. For example, the crack blocking structure 46 may include at least one groove. The groove may extend along the outer edge 12S1 of the flexible substrate 12, and both ends of the groove may be, for example, adjacent to the outer edge 12S2 of the flexible substrate 12. In some embodiments, the groove adjacent to the outer edge 12S2 may be bent toward the peripheral circuit region R2, so that at least one end of the groove may be adjacent to the peripheral circuit region R2, but not limited thereto. In some embodiments, the peripheral circuit region R2 may surround or partially surround the display region R1, or be located on one side of the display region R1. In some embodiments, the crack blocking structure 46 as shown in FIG. 9 may be applied to any of the aforementioned or the following embodiments.

Figure 10:
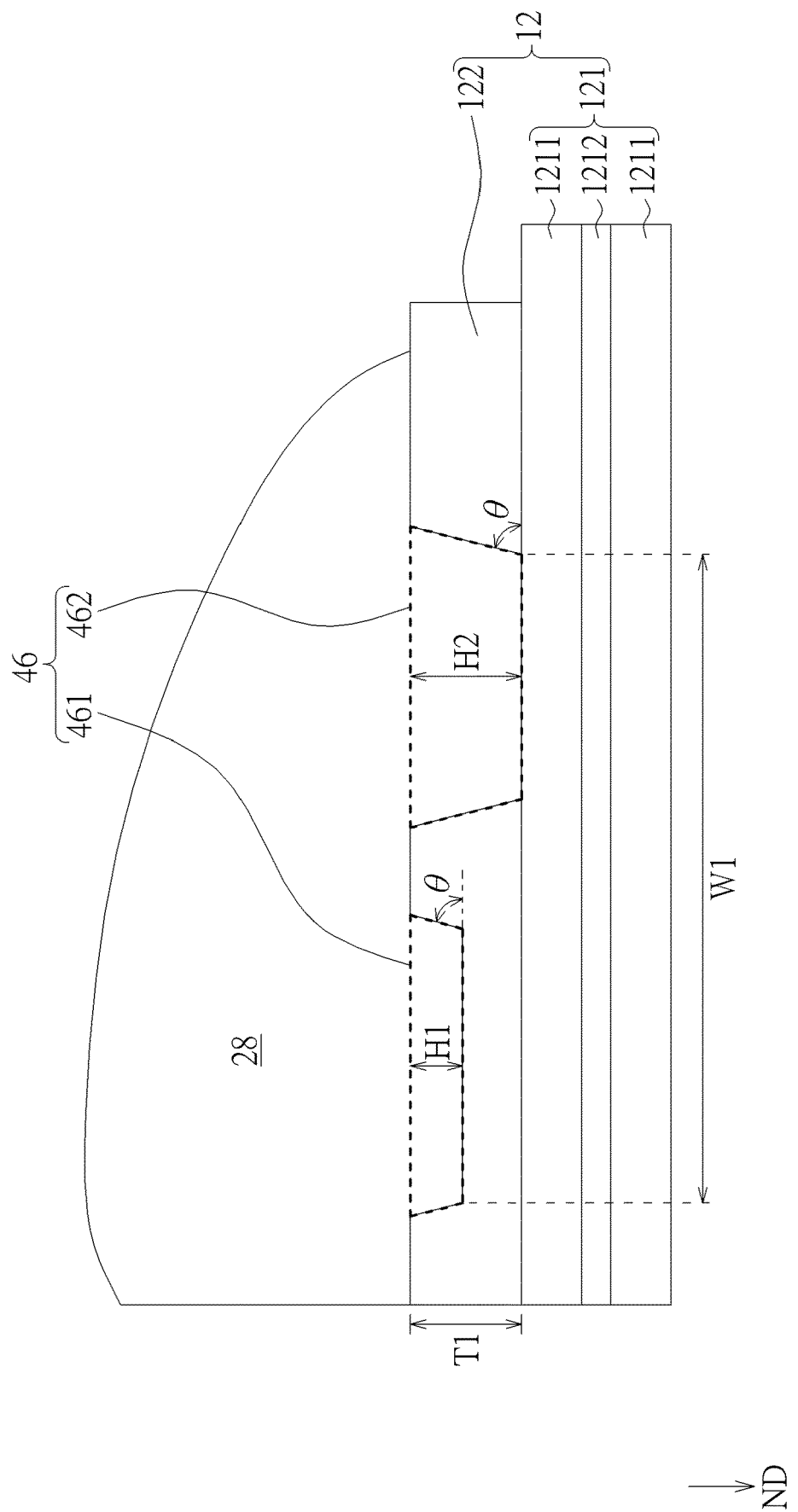
FIG. 10 is a schematic cross-sectional view of a display panel according to some embodiments of the present disclosure.

FIG. 10 is a schematic cross-sectional view of a display panel according to some embodiments of the present disclosure. As shown in FIG. 10, in some embodiments, the crack blocking structure 46 may have at least one groove, and the groove may be located in the buffer layer 122. In FIG. 10, the buffer layer 122 may be, for example, a single-layered inorganic insulating layer, and the crack blocking structure 46 includes a groove 461 and a groove 462 as an example, but not limited thereto. In this case, the width W1 of the crack blocking structure 46 may be defined as the distance from the edge of the groove 461 closest to the display region (for example, the display region R1 shown in FIG. 9) to the edge of the groove 462 farthest from the display region (viewed from the cross-sectional direction of FIG. 10), where the groove 461 is closest to the display region and the groove 462 is farthest from the display region. In some embodiments, the width W1 of the crack blocking structure 46 may be the distance from the edge at the bottom of the groove 461 closest to the display region to the edge at the bottom of the groove 462 farthest from the display region (viewed from the section direction), where the groove 461 is closest to the display region and the groove 462 is farthest from the display region.

As shown in FIG. 10, in an embodiment, a depth of a groove (for example, the depth H1 of the groove 461) may be less than the thickness T1 of the buffer layer 122. In some embodiments, a groove (for example, the groove 462) may penetrate through the buffer layer 122 to expose the substrate 121, and the groove 462 may have a depth H2 that is approximately the same as the thickness T1 of the buffer layer 122. In some embodiments, a groove (for example, the groove 462) may penetrate through the buffer layer 122 and a part of the substrate 121, and the depth H2 of the groove 462 may be greater than the thickness T1 of the buffer layer 122. In some embodiments, the protection layer 28 may be disposed in the groove 461 and the groove 462, but not limited thereto. In some embodiments, the buffer layer 122 may have a taper angle θ at the sidewall of the groove 461 and/or the groove 462, and the taper angle θ may be, for example, ranged from about 70 degrees to about 90 degrees, such as 80 degrees, but not limited thereto. In some embodiments, the crack blocking structure 46 as shown in FIG. 10 may be applied to any of the aforementioned or the following embodiments.

Figure 11:
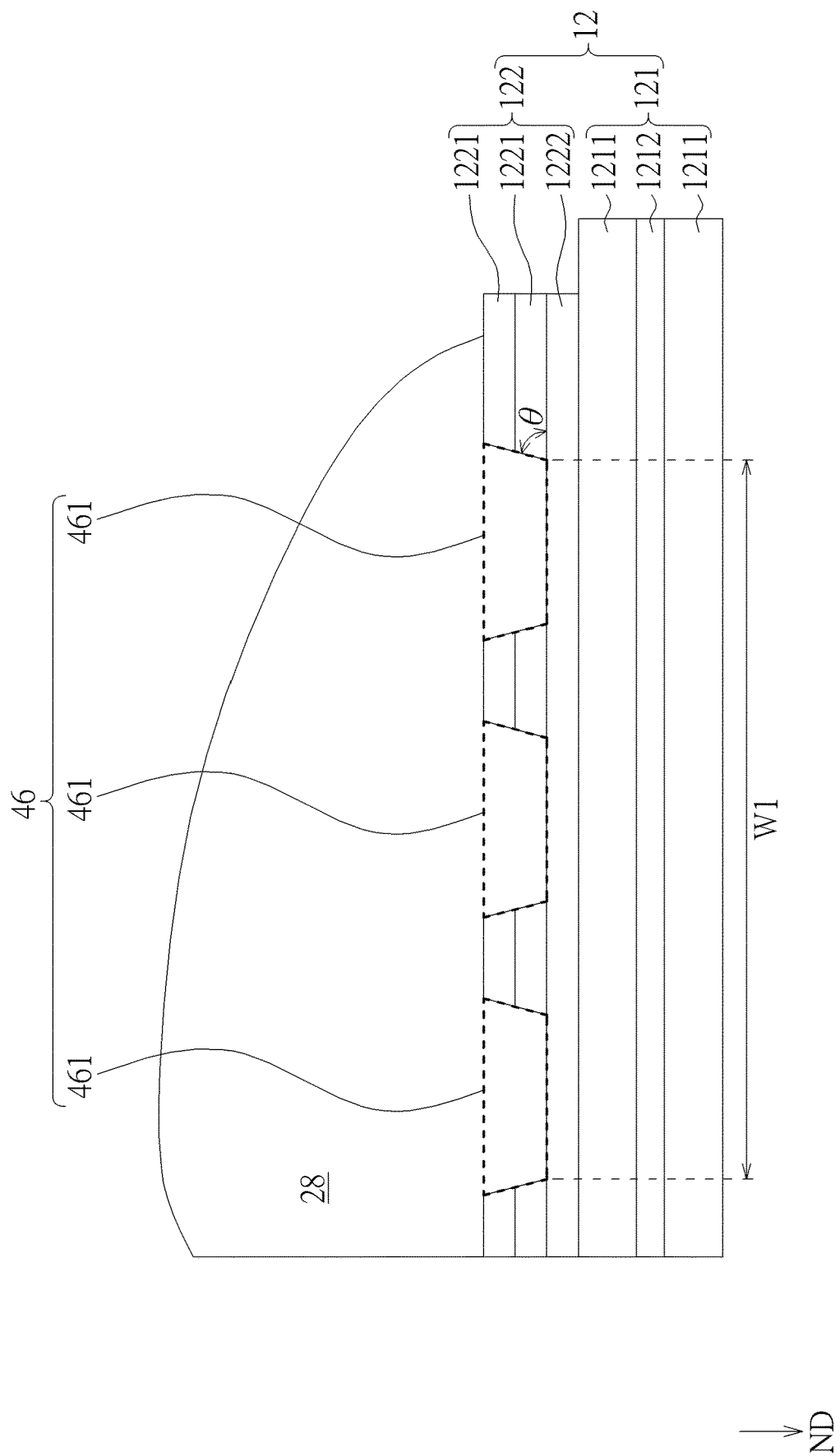
FIG. 11 is a schematic cross-sectional view of a display panel according to some embodiments of the present disclosure.

FIG. 11 is a schematic cross-sectional view of a display panel according to some embodiments of the present disclosure. As shown in FIG. 11, in some embodiments, the buffer layer 122 of the flexible substrate 12 may be, for example, a single-layered structure or a multi-layered structure. The multi-layered structure may include, for example, an inorganic insulating layer 1221 and an inorganic insulating layer 1222. The groove 461 of the crack blocking structure 46 may penetrate through the inorganic insulating layer 1221, but does not penetrate through the inorganic insulating layer 1222. The number of the inorganic insulating layer 1221 and the number of the inorganic insulating layer 1222 may each be, for example, one or more layers. In the embodiment of FIG. 11, the groove 461 may penetrate through the multiple inorganic insulating layers 1221, and the groove 461 does not penetrate through the inorganic insulating layer 1222. The inorganic insulating layer 1221 penetrated by the groove 461 may have a taper angle θ, and the taper angle θ may be, for example, ranged from about 70 degrees to about 90 degrees.

In the embodiment of FIG. 11, the width W1 of the crack blocking structure 46 may be defined as the distance from the edge (that is closest to the display region) of one groove 461 closest to the display region (for example, the display region R1 as shown in FIG. 9) to the edge (that is farthest from the display region) of another groove 461 farthest from the display region (viewed from the cross-sectional direction). In some embodiments, the width W1 of the crack blocking structure 46 may be the distance from the edge (that is closest to the display region) at the bottom of one groove 461 closest to the display region to the edge (that is farthest from the display region) at the bottom of another groove 461 farthest from the display region (viewed from the cross-sectional direction). For example, the width W1 of the crack blocking structure 46 may be greater than or equal to 10 μm, and less than or equal to 100 μm (10 μm≤W1≤100 μm), such as 30 μm, 50 μm, 70 μm, or 90 μm, but not limited thereto. Alternatively, the width W1 of the crack blocking structure 46 may be greater than or equal to 20 μm and less than or equal to 40 μm (20 μm≤W1≤40 μm). In some embodiments, the crack blocking structure 46 shown in FIG. 11 may be applied to any of the aforementioned or the following embodiments.

Figure 12:
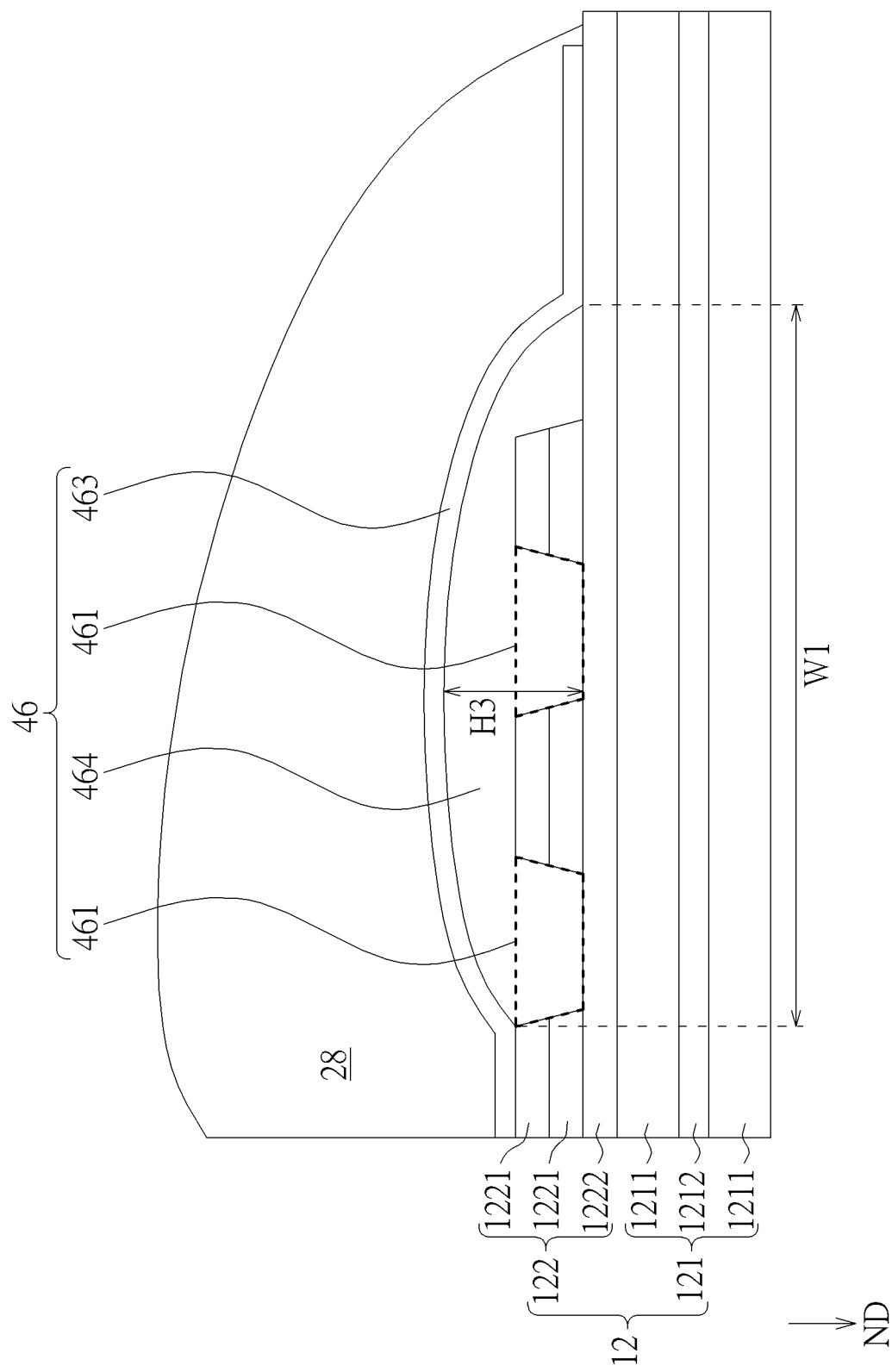
FIG. 12 is a schematic cross-sectional view of a display panel according to some embodiments of the disclosure.

FIG. 12 is a schematic cross-sectional view of a display panel according to some embodiments of the present disclosure. As shown in FIG. 12, in some embodiments, in addition to the grooves 461, the crack blocking structure 46 may further include an inorganic insulating layer 463 and an organic insulating layer 464 which are disposed between the protection layer 28 and the buffer layer 122. In the embodiment of FIG. 12, the organic insulating layer 464 may be disposed in the grooves 461, and the inorganic insulating layer 463 is disposed on the organic insulating layer 464 and the buffer layer 122, such that the part of the inorganic insulating layer 463 disposed on the organic insulating layer 464 is separated from the buffer layer 122. In the embodiment of FIG. 12, a cross section from the side of the groove 461 near the display region (for example, the display region R1 shown in FIG. 9) to the side of the groove 461 near the dummy region (for example, the dummy region R3 shown in FIG. 9) is observed. In the cross section, for example, perpendicular to the extending direction of the crack blocking structure 46, the width W1 of the crack blocking structure 46 may be defined as the distance from the projection of a starting point to the projection of an end point projected onto the same horizontal plane (for example, the surface of the substrate 121), where the starting point and the end point are respectively two points where the inorganic insulating layer 463 starts to and ends to be separated from the buffer layer 122. In this case, the width W1 of the crack blocking structure 46 may be greater than or equal to 10 μm and less than or equal to 100 μm (10 μm≤W1≤100 μm), such as 20 μm, 40 μm, 60 μm, or 84 μm. In some embodiments, the organic insulating layer 464 may have a maximum height H3, and the height H3 may be, for example, greater than or equal to 0.5 μm and less than or equal to 10 μm (0.5 μm≤H3≤10 μm), such as 2 μm, 4 μm, 6 μm, or 8 μm, or greater than or equal to 1 μm and less than or equal to 3 μm (1 μm≤H3≤3 μm). In the embodiment of FIG. 12, a part of the inorganic insulating layer 463 may be in contact with the uppermost inorganic insulating layer 1221 of the buffer layer 122, and another part of the inorganic insulating layer 463 may be in contact with the inorganic insulating layer 1222 of the buffer layer 122, but not limited thereto. In some embodiments, the parts of the inorganic insulating layer 463 located on two sides of the organic insulating layer 464 may be both in contact with the uppermost inorganic insulating layer 1221 of the buffer layer 122.

In some embodiments, the inorganic insulating layer 1222 of the buffer layer 122 that is not penetrated by the grooves 461 may have a single-layered structure or a multi-layered structure. For example, the multi-layered structure of the inorganic insulating layer 1222 may include different insulating materials, such as silicon oxide or silicon nitride, respectively. For example, silicon oxide layers and silicon nitride layers may be alternately stacked. In some embodiments, the inorganic insulating layer 463 may have a single-layered structure or a multi-layered structure. For example, the multi-layered structure of the inorganic insulating layer 463 may include different insulating materials, such as silicon oxide or silicon nitride, respectively. For example, silicon oxide layers and silicon nitride layers may be alternately stacked. In some embodiments, the crack blocking structure 46 described above may be applied to any of the aforementioned or the following embodiments.

Figure 13:
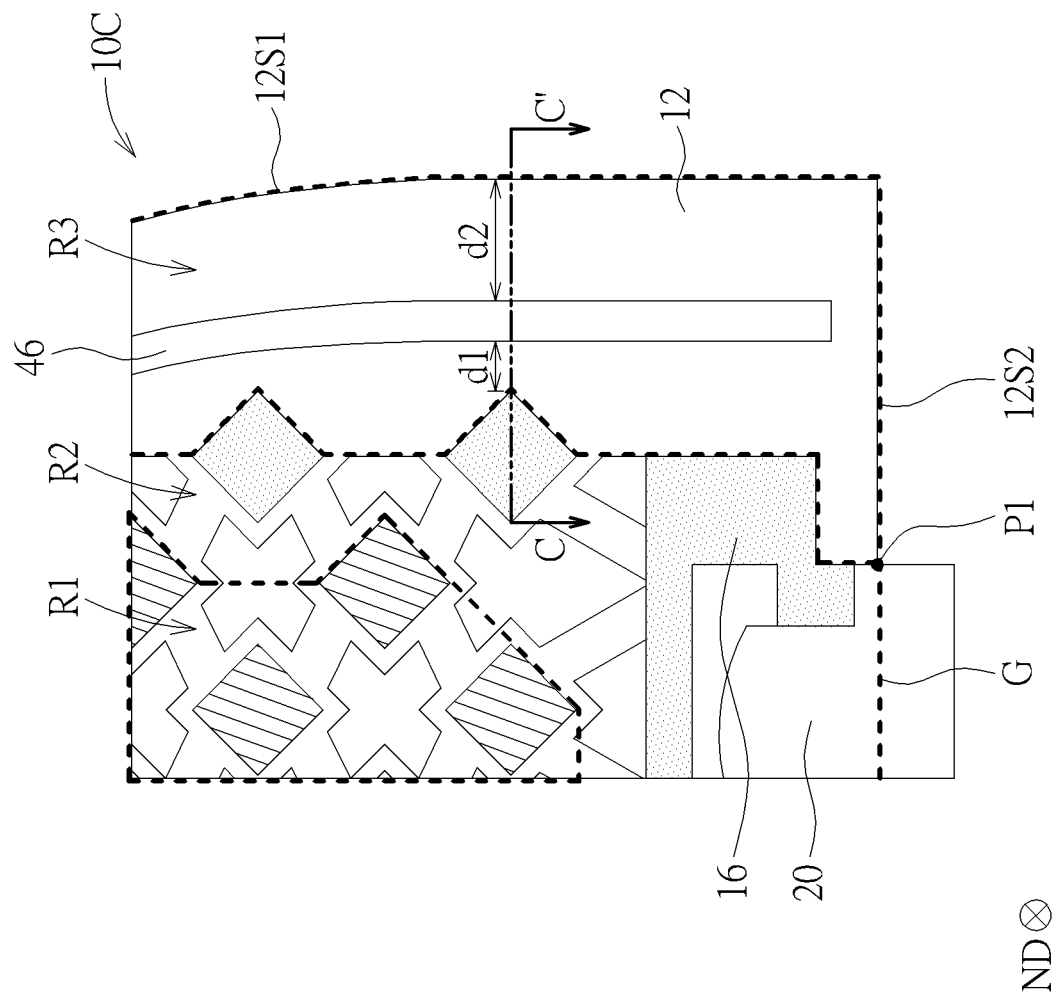
FIG. 13 is a schematic partial top view of a display panel according to some embodiments of the present disclosure.
Figure 14:
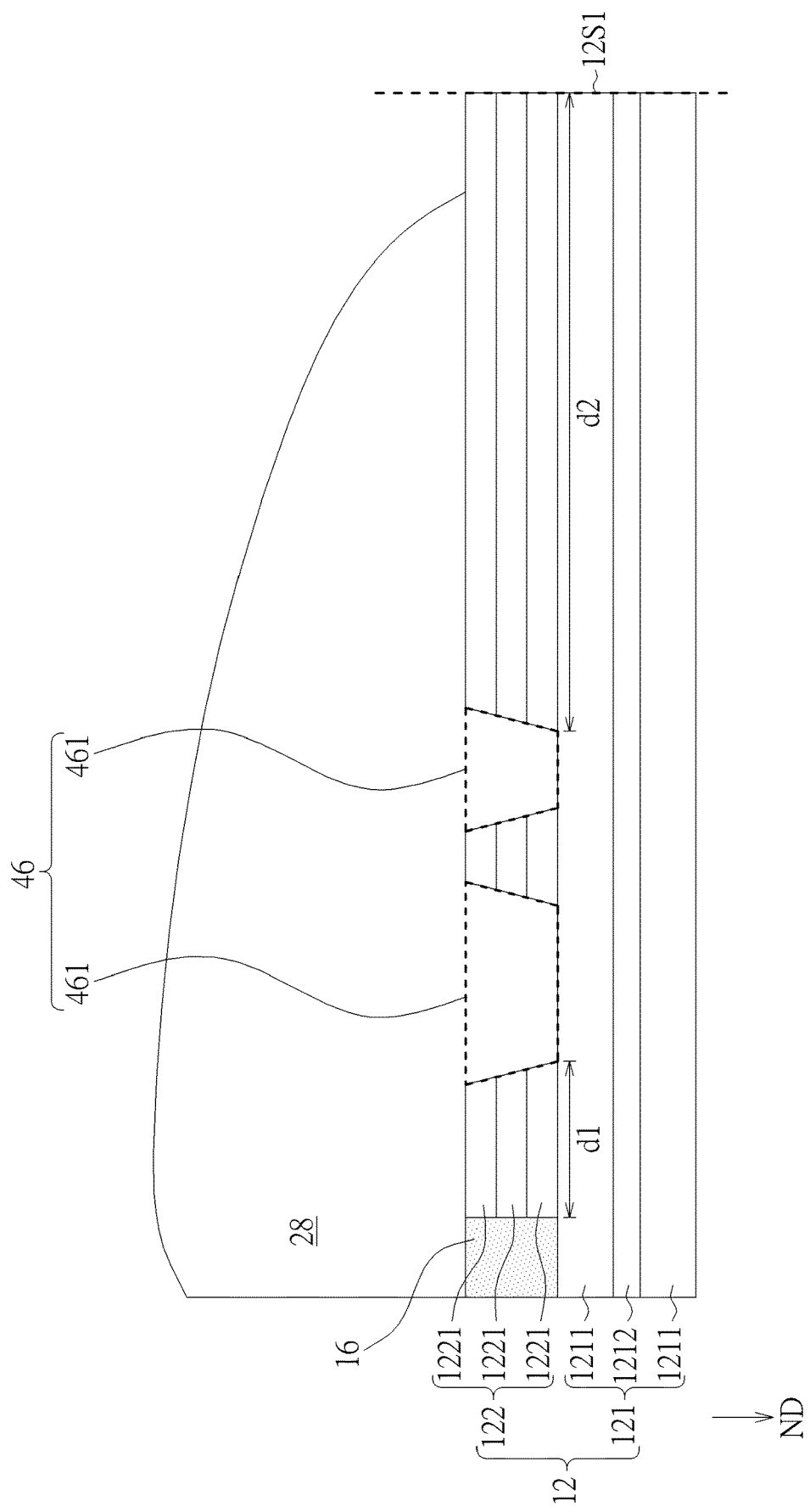
FIG. 14 is a schematic cross-sectional view taken along the cross-sectional line C-C' of FIG. 13.

FIG. 13 is a schematic partial top view of a display panel according to some embodiments of the present disclosure. FIG. 14 is a schematic cross-sectional view taken along the cross-sectional line C-C' of FIG. 13. In order to clearly show the relationships between the crack blocking structure 46 and the outer edge of the flexible substrate 12 and between the crack blocking structure 46 and the peripheral circuit 16, FIG. 13 illustrates the part of the flexible substrate 12 adjacent to the junction of the outer edge 12S1 and the outer edge 12S2, but not limited thereto. As shown in FIG. 13, in some embodiments, a distance d1 between the crack blocking structure 46 and the peripheral circuit region R2 may be less than a distance d2 between the crack blocking structure 46 and the outer edge of the dummy region R3. As shown in FIG. 13, the distance d1 may be, for example, the distance (minimum distance) between the groove 461 and the peripheral circuit region R2 in the direction parallel to the extending direction of the gap G, and the distance d2 may be between the groove 461 and the outer edge of the flexible substrate 12 (i.e., the outer edge 12S1 of the dummy region R3) along the extension line of the distance d1. It should be noted that since the distance d1 is less than the distance d2, when the display panel 10C is cut, the damage of the crack blocking structure 46 caused by cutting may be reduced.

In some embodiments, as shown in FIG. 13, a part of the dummy region R3 may extend to be between the peripheral circuit region R2 and the outer edge 12S2 of the flexible substrate 12, but not limited thereto.

In the embodiment of FIG. 14, when the crack blocking structure 46 includes a plurality of grooves 461, the distance d1 between the crack blocking structure 46 and the peripheral circuit region R2 may refer to the distance between the outer edge of the grooves 461 and the peripheral circuit 16 as viewed from the top view direction ND of the display panel 10C, where this groove 461 is closest to the peripheral circuit region R2, and the outer edge is at the bottom of the groove 461 and adjacent to the peripheral circuit region R2. The distance d2 between the crack blocking structure 46 and the outer edge of the dummy region R3 may refer to the distance between the edge of the groove 461 and the outer edge of the flexible substrate 12 as viewed from the top view direction ND of the display panel 10C, where this groove 461 is closest to the outer edge of the flexible substrate 12, and the outer edge is at the bottom of the groove 461 and adjacent to the outer edge of the flexible substrate 12. In some embodiments, as shown in FIG. 14, the groove 461 may penetrate through the buffer layer 122, but not limited thereto.

In some embodiments, when the crack blocking structure 46 is the structure as shown in FIG. 12, the distance d1 between the crack blocking structure 46 and the peripheral circuit region R2 may refer to the distance between the outer edge of the organic insulating layer 464 adjacent to the peripheral circuit region R2 and the peripheral circuit 16 as viewed from the top view direction ND of the display panel 10C. The distance d2 between the crack blocking structure 46 and the outer edge of the dummy region R3 may refer to the distance between the edge of the organic insulating layer 464 adjacent to the outer edge of the dummy region R3 and the outer edge of the dummy region R3.

FIG. 15 is a schematic top view of a window according to some embodiments of the present disclosure. As shown in FIG. 15, the width W2 of the dummy region R3 may be greater than or equal to 50 μm and less than or equal to half of the width W3 of the display region R1 (50 μm≤W2≤0.5× W3). The width W3 of the display region R1 herein may be defined as the maximum width of the display region R1 in any direction. For example, the width W2 of the dummy region R3 may be the minimum width of the dummy region R3 in the direction parallel to the extending direction of the gap G, and the width W3 of the display region R1 may be the maximum width in the direction parallel to the extending direction of the gap G. It should be noted that the dummy region R3 with sufficient width may allow the deviation of attaching when the display panel 10D is attached to the transparent substrate 2, thereby reducing the error caused by attaching the light-emitting units 14 and/or the peripheral circuit 16 to a region beyond the transparent substrate 2. Alternatively, due to the deposition process, such as a physical vapor deposition or a chemical vapor deposition, the film thickness formed in the region adjacent to the edge of the substrate (for example, the substrate 121 shown in FIG. 5) is likely to be uneven. Therefore, through the aforementioned range of the width W2 of the dummy region R3, it may reduce or prevent the peripheral circuit 16 from being formed of an uneven film.

In some embodiments, the dummy region R3 may be adjacent to the display region R1, so that the peripheral circuit region R2 is located on the side of the display region R1 adjacent to the gap G. This placement may be applied to any of the aforementioned or the following embodiments. In some embodiments, the peripheral circuit region R2 of the embodiment of FIG. 15 may also surround or partially surround the display region R1.

Figure 17:
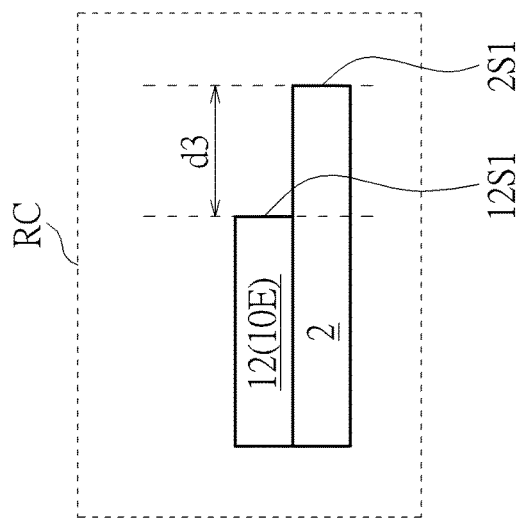
FIG. 17 is a schematic cross-sectional view of the display panel and the transparent substrate in a region RC of FIG. 16 after being attached and cut.
Figure 16:
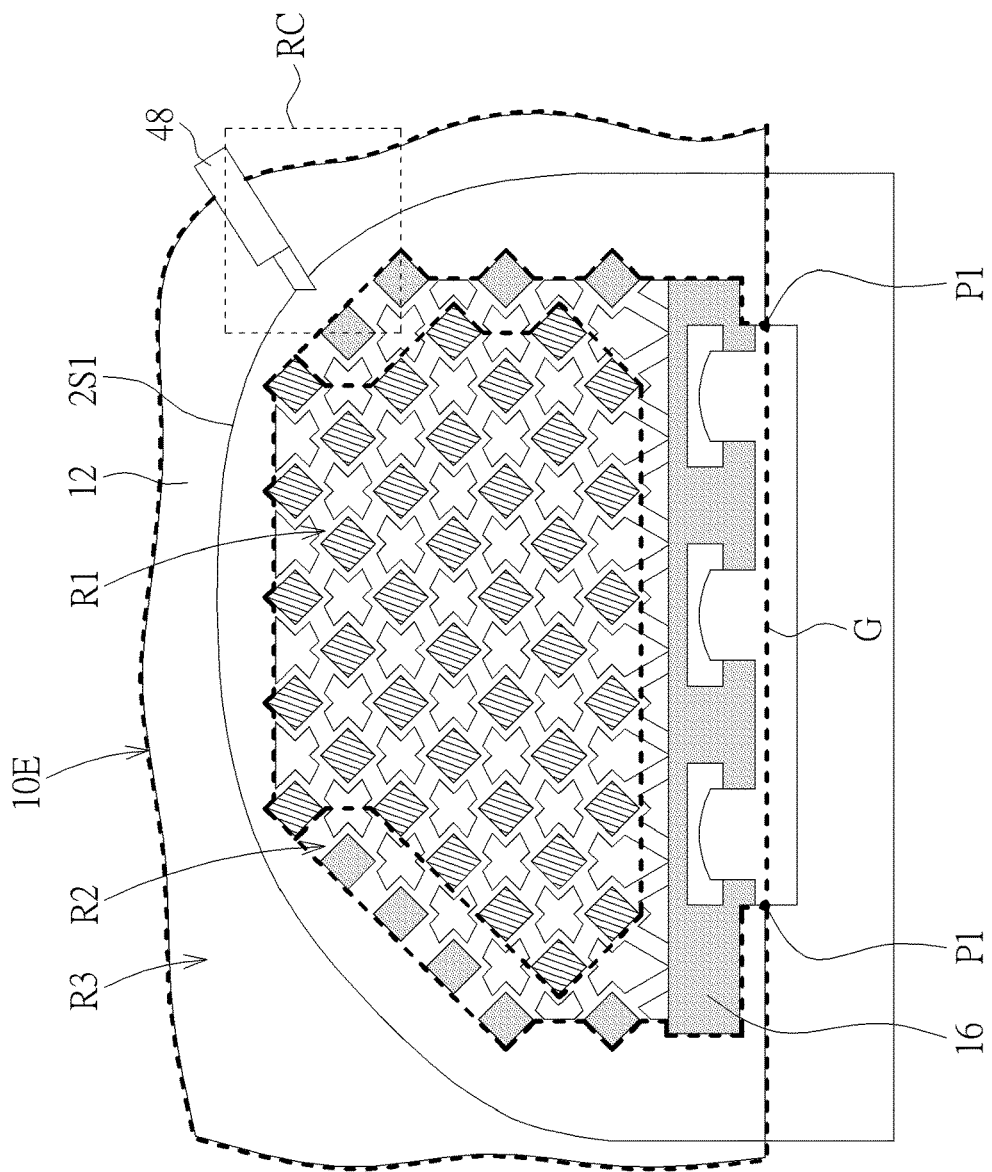
FIG. 16 is a schematic top view of a display panel attached to a transparent substrate and before being cut according to some embodiments of the present disclosure.

FIG. 16 is a schematic top view of a display panel attached to a transparent substrate before cutting according to some embodiments of the present disclosure. FIG. 17 is a schematic cross-sectional view of the display panel and the transparent substrate of a region RC in FIG. 16 after attaching and cutting. As shown in FIG. 16, before cutting the display panel 10E, the dimension of the display panel 10E may be greater than the exposed portion 2A of the transparent substrate 2. In addition, after the display panel 10E is attached to the transparent substrate 2, a cutting tool 48 may be used to remove the portion of the display panel 10E beyond the edge of the transparent substrate 2. In detail, the portion of the display panel 10E that exceeds the transparent substrate 2 is the dummy region R3 of the flexible substrate 12, so that a part of the dummy region R3 of the flexible substrate 12 is removed while cutting. Therefore, through designing the dummy region R3 of the flexible substrate 12 to extend beyond the outer edge of the exposed portion 2A of the transparent substrate 2 before cutting, the difficulty of alignment may be reduced and/or the duration of attaching may be reduced.

As shown in FIG. 17, after cutting the display panel 10E, there is a distance d3 between the outer edge of the display panel 10E (for example, the outer edge 12S1 of the flexible substrate 12) and the outer edge of the transparent substrate 2 (for example, the outer edge 2S1 of the transparent substrate 2). For example, the distance d3 may be greater than or equal to 1 millimeter (mm) and less than or equal to 20 millimeters (1 mm≤d3≤20 mm), such as 5 mm, 10 mm, or 15 mm, but not limited thereto. It should be noted that in the application of vehicle windows, the distance d3 between the outer edge of the display panel 10E and the outer edge of the transparent substrate 2 may be used to reduce the peeling of the display panel 10E caused by the opening and closing of the window. In some embodiments, the shape of the display panel 10E before cutting may be the same or similar to the shape of the transparent substrate 2. Alternatively, the shape of the display panel 10E may be the same as the shape of the transparent substrate 2 after cutting.

FIG. 18 is a schematic top view of a window according to some embodiments of the present disclosure. As shown in FIG. 18, in some embodiments, the opening 12a may be further located in the dummy region R3. Specifically, the flexible substrate 12 in the dummy region R3 may also have a patterned structure, that is, the flexible substrate 12 may include a plurality of sub-openings 12a1 disposed in the dummy region R3. Therefore, the opening 12a composed of all the sub-openings 12a1 may be located in the display region R1, the peripheral circuit region R2, and the dummy region R3. In detail, the sheet-shaped portion 12P3 of the flexible substrate 12 may overlap with the door 3 of a vehicle in the top view direction ND of the display panel 10F, and is disposed on the shielded portion 2B of the transparent substrate 2. Therefore, a plurality of island-shaped portions 12P1 and a plurality of connecting portions 12P2 of the flexible substrates 12 may be disposed in the display region R1, the peripheral circuit region R2, and the dummy region R3. In this case, the outer edge of a part of the dummy region R3 may be defined by the outer edges or the connection line of the outer corners of the outermost island-shaped portions 12P1 of the flexible substrate 12. Through disposing the opening 12a in the dummy region R3, the display panel 10F may substantially conform to the curved surface 2S that has a Gauss curvature of not zero and is bent toward at least two different directions at the same time.

In some embodiments, the shapes of the island-shaped portions 12P1 in the display region R1, the peripheral circuit region R2, and the dummy region R3 may be substantially the same, or the shapes of the island-shaped portions 12P1 in at least two of the aforementioned regions may be different. For example, the shape of the island-shaped portion 12P1 may include a rhombus, a rectangle, or other suitable shapes. In some embodiments, the sizes of the island-shaped portions 12P1 in the display region R1, the peripheral circuit region R2 and the dummy region R3 may be substantially the same, or the sizes of the island-shaped portions 12P1 in at least two of the aforementioned regions may be different. For example, the size of the island-shaped portion 12P1 in the dummy region R3 may be greater than the size of the island-shaped portion 12P1 in the peripheral circuit region R2, and the size of the island-shaped portion 12P1 in the peripheral circuit region R2 may be greater than the size of the island-shaped portion 12P1 in the display region R1, but not limited thereto.

In some embodiments, the peripheral circuit 16 may include wires 50 disposed on at least one of the island-shaped portions 12P1. In some embodiments, the peripheral circuit 16 may include a circuit 52 and wires 50 disposed on at least one of the island-shaped portions 12P1.

In some embodiments, when the opening 12a may be further located in the dummy region R3, the display region R1 may be adjacent to the dummy region R3. For example, the peripheral circuit region R2 may partially surround the display region R1. Alternatively, the dummy region R3 may be adjacent to the display region R1, so that the peripheral circuit region R2 is located on the side of the display region R1 adjacent to the gap G.

In summary, in the windows of the present disclosure, the transparent substrate has a Gauss curvature that is not equal to zero. In order to reduce damage to the peripheral circuit and the light-emitting units in the display panel after being attached to the transparent substrate, the flexible substrate of the display panel may have a dummy region without a conductor and a semiconductor on the periphery of the peripheral circuit. Therefore, when the display panel is attached to the transparent substrate or the display panel is cut, the dummy region of the flexible substrate may provide a buffer for attaching or cutting. Alternatively, the placement of the dummy region may also reduce the influence of the cracks at the outer edge of the flexible substrate upon the light-emitting units and the peripheral circuit. Through the aforementioned designs, the flexible display panel may be attached to the curved surface with the Gauss curvature that is not equal to zero, thereby enhancing the application fields of the display panels.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display panel, comprising:
a flexible substrate comprising:
   a dummy region comprising an outer edge, an inner edge, a first side edge, and a second side edge, wherein the first side edge is connected between the outer edge and the inner edge, and the second side edge is connected between the outer edge and the inner edge,
   wherein the inner edge of the dummy region is concaved toward the outer edge of the dummy region; and
   a first region, wherein the first region is surrounded by the inner edge of the dummy region and a first part of a border of the flexible substrate, and the first region comprises a display region and a peripheral region,
   wherein the first side edge of the dummy region is a second part of the border of the flexible substrate, and the second side edge of the dummy region is a third part of the border of the flexible substrate,
   wherein the outer edge of the dummy region has a curved shape, and is a fourth part of the border of the flexible substrate, and the first part is connected between the second part and the third part of the border of the flexible substrate;
a plurality of light-emitting units disposed in the display region;
a peripheral circuit disposed in the peripheral region for driving the plurality of light-emitting units, wherein the peripheral circuit comprises a plurality of wires extending to the first part of the border of the flexible substrate; and
a circuit board electrically connected to the peripheral circuit, wherein the circuit board is overlapped with the first part of the border of the flexible substrate and overlapped with the plurality of wires.

2. The display panel as claimed in claim 1, wherein the flexible substrate is a stretchable substrate.

3. The display panel as claimed in claim 1, wherein a length of the first part of the border of the flexible substrate is less than a total length of the outer edge, the first side edge and the second side edge of the dummy region.

4. The display panel as claimed in claim 3, wherein the length of the first part of the border of the flexible substrate is less than half of the total length of the outer edge, the first side edge and the second side edge of the dummy region.

5. The display panel as claimed in claim 3, wherein a ratio of the length of the first part of the border of the flexible substrate to the total length of the outer edge, the first side edge and the second side edge of the dummy region is ranged from 0.1 to 0.4.

6. The display panel as claimed in claim 1, wherein the flexible substrate comprises a first opening in the display region and a second opening in the peripheral region.

7. The display panel as claimed in claim 6, wherein the flexible substrate comprises a third opening in the dummy region.

8. The display panel as claimed in claim 3, wherein the display region is partially enclosed by the dummy region, and a width of the dummy region is greater than 50 micrometers and less than half of a width of the display region, and the widths are measured in a direction parallel to a connecting line between the first side edge and the second side edge of the inner edge of the dummy region.

9. The display panel as claimed in claim 1, wherein the flexible substrate has at least one groove in the dummy region.

10. The display panel as claimed in claim 9, wherein a distance between the at least one groove and the peripheral region is less than a distance between the at least one groove and the outer edge of the dummy region.

11. The display panel as claimed in claim 1, wherein the dummy region is adjacent to the display region.

12. A window, comprising:
a transparent substrate and the display panel as claimed in claim 1 disposed thereon.

13. The window as claimed in claim 12, wherein the transparent substrate has a Gauss curvature not equal to zero.

14. The display panel as claimed in claim 1, wherein the dummy region is defined as a region without a conductor and a semiconductor thereon, and the dummy region is disposed outside the peripheral region and the display region.

15. The display panel as claimed in claim 1, wherein the flexible substrate in the display region comprises a plurality of openings, and the plurality of openings are surrounded by a same layer of the flexible substrate.

16. The display panel as claimed in claim 1, wherein the flexible substrate in the display region comprises a plurality of island-shaped portions and a plurality of connecting portions, wherein the plurality of island-shaped portions comprises a first island-shaped portion, a second island-shaped portion, a third island-shaped portion, and a fourth island-shaped portion, wherein the plurality of connecting portions comprises a first connecting portion, a second connecting portion, a third connecting portion, and a fourth connecting portion, wherein the first and the second island-shaped portions are connected by the first connecting portion, the second and the third island-shaped portions are connected by the second connecting portion, the third and the fourth island-shaped portions are connected by the third connecting portion, and the fourth and the first island-shaped portions are connected by the fourth connecting portion, wherein an opening is surrounded by the first, the second, the third, and the fourth island-shaped portion, and the first, the second, the third, and the fourth connecting portions.

* * * * *